(12) United States Patent
Tandon et al.

(10) Patent No.: US 11,961,875 B2
(45) Date of Patent: Apr. 16, 2024

(54) MONOLITHIC SEGMENTED LED ARRAY ARCHITECTURE WITH ISLANDED EPITAXIAL GROWTH

(71) Applicant: Lumileds LLC, San Jose, CA (US)

(72) Inventors: Ashish Tandon, Sunnyvale, CA (US); Rajat Sharma, San Jose, CA (US); Joseph Flemish, Palo Alto, CA (US); Andrei Papou, San Jose, CA (US); Wen Yu, Pleasanton, CA (US); Erik William Young, San Jose, CA (US); Yu-Chen Shen, San Jose, CA (US); Luke Gordon, Santa Barbara, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 18/156,747

(22) Filed: Jan. 19, 2023

(65) Prior Publication Data
US 2023/0154970 A1     May 18, 2023

Related U.S. Application Data

(63) Continuation of application No. 16/226,288, filed on Dec. 19, 2018, now abandoned.
(Continued)

(51) Int. Cl.
*H01L 27/15*       (2006.01)
*F21S 41/153*     (2018.01)
(Continued)

(52) U.S. Cl.
CPC .......... *H01L 27/156* (2013.01); *F21S 41/153* (2018.01); *H01L 33/007* (2013.01);
(Continued)

(58) Field of Classification Search
CPC ...... F21S 41/153; H01L 33/502; H01L 33/32; H01L 2933/0041
See application file for complete search history.

(56) References Cited

U.S. PATENT DOCUMENTS 6,410,942 B1    6/2002   Thibeault et al.
6,657,236 B1   12/2003   Thibeault et al.
(Continued)

FOREIGN PATENT DOCUMENTS

DE     102010051286 A1     5/2012
DE     102012109460 A1     4/2014
(Continued)

OTHER PUBLICATIONS

European Search Report dated Aug. 29, 2018 from European Application No. 18159072, 14 pages.
(Continued)

*Primary Examiner* — Vincent Wall
(74) *Attorney, Agent, or Firm* — Servilla Whitney LLC

(57) ABSTRACT

A device may include a metal contact between a first isolation region and a second isolation region on a first surface of an epitaxial layer. The device may include a first sidewall and a second sidewall on a second surface of the epitaxial layer distal to the first isolation region and the second isolation region. The device may include a wavelength converting layer on the epitaxial layer between the first sidewall and the second sidewall.

10 Claims, 26 Drawing Sheets

Related U.S. Application Data

(60) Provisional application No. 62/608,316, filed on Dec. 20, 2017.

(51) Int. Cl.

| | | |
|---|---|---|
| *H01L 33/00* | (2010.01) | |
| *H01L 33/08* | (2010.01) | |
| *H01L 33/20* | (2010.01) | |
| *H01L 33/30* | (2010.01) | |
| *H01L 33/32* | (2010.01) | |
| *H01L 33/36* | (2010.01) | |
| *H01L 33/50* | (2010.01) | |
| *H01S 5/00* | (2006.01) | |

(52) U.S. Cl.
CPC ............ *H01L 33/20* (2013.01); *H01L 33/305* (2013.01); *H01L 33/502* (2013.01); *H01L 33/505* (2013.01); *H01L 33/507* (2013.01); *H01S 5/00* (2013.01); *H01L 33/0093* (2020.05); *H01L 33/08* (2013.01); *H01L 33/32* (2013.01); *H01L 33/36* (2013.01); *H01L 2933/0016* (2013.01); *H01L 2933/0041* (2013.01)

(56) References Cited

U.S. PATENT DOCUMENTS

| | | |
|---|---|---|
| 6,821,804 B2 | 11/2004 | Thibeault et al. |
| 7,943,406 B2 | 5/2011 | Slater, Jr. et al. |
| 8,222,811 B2 | 7/2012 | Vaufrey et al. |
| 8,258,044 B2 | 9/2012 | Brun et al. |
| 8,487,340 B2 | 7/2013 | Gilet et al. |
| 8,638,032 B2 | 1/2014 | Maindron et al. |
| 8,647,957 B2 | 2/2014 | Borowik et al. |
| 8,697,548 B2 | 4/2014 | Borowik et al. |
| 8,698,396 B2 | 4/2014 | Maindron et al. |
| 8,754,426 B2 | 6/2014 | Marx et al. |
| 8,890,111 B2 | 11/2014 | Templier et al. |
| 8,969,900 B2 | 3/2015 | Sabathil et al. |
| 9,093,607 B2 | 7/2015 | Gilet et al. |
| 9,109,296 B2 | 8/2015 | Metaye et al. |
| 9,112,112 B2 | 8/2015 | Do et al. |
| 9,192,290 B2 | 11/2015 | Spinnler et al. |
| 9,209,366 B2 | 12/2015 | Maindron et al. |
| 9,263,633 B2 | 2/2016 | Gilet et al. |
| 9,396,970 B2 | 7/2016 | Gillot et al. |
| 9,422,628 B2 | 8/2016 | Simonato et al. |
| 9,496,465 B2 | 11/2016 | Sugimoto et al. |
| 9,507,204 B2 | 11/2016 | Pelka et al. |
| 9,601,542 B2 | 3/2017 | Robin et al. |
| 9,722,160 B2 | 8/2017 | Nakabayashi |
| 9,768,350 B2 | 9/2017 | Bavencove et al. |
| 9,859,330 B2 | 1/2018 | Von Malm et al. |
| 9,887,184 B2 | 2/2018 | Takeya et al. |
| 9,945,526 B2 | 4/2018 | Singer et al. |
| 9,978,727 B2 | 5/2018 | Takeya et al. |
| 9,997,688 B2 | 6/2018 | Takeya et al. |
| 10,002,928 B1 | 6/2018 | Raring et al. |
| 10,018,325 B2 | 7/2018 | Kim et al. |
| 10,050,026 B2 | 8/2018 | Takeya et al. |
| 10,068,884 B2 | 9/2018 | Takeya et al. |
| 10,145,518 B2 | 12/2018 | Do et al. |
| 2002/0139987 A1 | 10/2002 | Collins, III et al. |
| 2003/0127658 A1 | 7/2003 | Sheu et al. |
| 2007/0206130 A1 | 9/2007 | Wuu et al. |
| 2008/0099787 A1 | 5/2008 | Coolbaugh et al. |
| 2008/0173884 A1 | 7/2008 | Chitnis et al. |
| 2008/0179602 A1 | 7/2008 | Negley et al. |
| 2010/0078656 A1 | 4/2010 | Seo et al. |
| 2011/0151607 A1 | 6/2011 | Landis et al. |
| 2011/0287606 A1 | 11/2011 | Brun et al. |
| 2012/0050694 A1* | 3/2012 | Huang .................. H01L 27/156 353/38 |
| 2012/0091481 A1* | 4/2012 | Sekine .................. H01L 33/486 257/88 |
| 2012/0205614 A1* | 8/2012 | Templier .............. H01L 27/156 977/762 |
| 2013/0020115 A1 | 1/2013 | Mataye et al. |
| 2013/0112945 A1 | 5/2013 | Gilet et al. |
| 2013/0256708 A1 | 10/2013 | Jin et al. |
| 2014/0077156 A1 | 3/2014 | Bavencove et al. |
| 2014/0094878 A1 | 4/2014 | Gossler et al. |
| 2014/0138719 A1 | 5/2014 | Maindron et al. |
| 2015/0118544 A1 | 4/2015 | Oukassi |
| 2015/0144590 A1 | 5/2015 | Simonato et al. |
| 2015/0228873 A1 | 8/2015 | Gebuhr et al. |
| 2015/0280060 A1 | 10/2015 | Gilet et al. |
| 2015/0380461 A1 | 12/2015 | Robin et al. |
| 2016/0079565 A1 | 3/2016 | Maindron et al. |
| 2016/0190400 A1 | 6/2016 | Jung et al. |
| 2016/0218240 A1 | 7/2016 | Bouvier et al. |
| 2016/0293811 A1 | 10/2016 | Hussell et al. |
| 2016/0336483 A1 | 11/2016 | Shatalov et al. |
| 2017/0080457 A1 | 3/2017 | Eymery et al. |
| 2017/0098746 A1 | 4/2017 | Bergmann et al. |
| 2017/0137645 A1 | 5/2017 | Manceau et al. |
| 2017/0186612 A1 | 6/2017 | Almadori et al. |
| 2017/0243860 A1 | 8/2017 | Hong et al. |
| 2017/0293065 A1 | 10/2017 | Kim |
| 2017/0294418 A1* | 10/2017 | Edmond ............... H01L 33/504 |
| 2017/0309794 A1 | 10/2017 | Von Malm |
| 2017/0358563 A1 | 12/2017 | Cho et al. |
| 2017/0358724 A1 | 12/2017 | Shichijo et al. |
| 2018/0017939 A1 | 1/2018 | Allier et al. |
| 2018/0019369 A1 | 1/2018 | Cho et al. |
| 2018/0019373 A1 | 1/2018 | Lehnhardt et al. |
| 2018/0061316 A1 | 3/2018 | Shin et al. |
| 2018/0074372 A1 | 3/2018 | Takeya et al. |
| 2018/0090540 A1 | 3/2018 | Von Malm et al. |
| 2018/0138157 A1 | 5/2018 | Im et al. |
| 2018/0145059 A1 | 5/2018 | Welch et al. |
| 2018/0149328 A1 | 5/2018 | Cho et al. |
| 2018/0156406 A1 | 6/2018 | Feil et al. |
| 2018/0166470 A1 | 6/2018 | Chae |
| 2018/0174519 A1 | 6/2018 | Kim et al. |
| 2018/0174931 A1 | 6/2018 | Henley |
| 2018/0210282 A1 | 7/2018 | Song et al. |
| 2018/0238511 A1 | 8/2018 | Hartmann et al. |
| 2018/0259137 A1 | 9/2018 | Lee et al. |
| 2018/0259570 A1 | 9/2018 | Henley |
| 2018/0272605 A1* | 9/2018 | Gmeinwieser ........ H01L 27/156 |
| 2018/0283642 A1* | 10/2018 | Liao ...................... F21S 43/15 |
| 2018/0297510 A1 | 10/2018 | Fiederling et al. |
| 2018/0339643 A1 | 11/2018 | Kim |
| 2018/0339644 A1 | 11/2018 | Kim |
| 2018/0354406 A1 | 12/2018 | Park |
| 2018/0371315 A1 | 12/2018 | Hofmann et al. |

FOREIGN PATENT DOCUMENTS

| | | |
|---|---|---|
| DE | 102014112551 A1 | 3/2016 |
| EP | 1378949 A1 | 1/2004 |
| EP | 2006921 A1 | 12/2008 |
| EP | 2027608 A1 | 2/2009 |
| EP | 2203939 A1 | 7/2010 |
| EP | 2211387 A2 | 7/2010 |
| EP | 2339658 A2 | 6/2011 |
| EP | 2491591 A1 | 8/2012 |
| EP | 2499958 A1 | 9/2012 |
| EP | 2521161 A1 | 11/2012 |
| EP | 2521162 A1 | 11/2012 |
| EP | 2553149 A1 | 2/2013 |
| EP | 2617069 A1 | 7/2013 |
| EP | 2674516 A1 | 12/2013 |
| EP | 2855744 B1 | 5/2016 |
| EP | 3053199 A1 | 8/2016 |
| EP | 3144272 A1 | 3/2017 |
| EP | 3410002 A1 | 12/2018 |
| EP | 3410003 A1 | 12/2018 |
| EP | 2710634 B1 | 10/2020 |
| FR | 2952366 A1 | 5/2011 |
| FR | 2964796 A1 | 3/2012 |

(56) References Cited

FOREIGN PATENT DOCUMENTS

| | | | |
|---|---|---|---|
| FR | 2969995 | A1 | 7/2012 |
| FR | 2972815 | A1 | 9/2012 |
| FR | 2974940 | A1 | 11/2012 |
| FR | 2974941 | A1 | 11/2012 |
| FR | 2975532 | A1 | 11/2012 |
| FR | 2991342 | A1 | 12/2013 |
| FR | 2991999 | A1 | 12/2013 |
| FR | 2998090 | A1 | 5/2014 |
| FR | 3011383 | A1 | 4/2015 |
| FR | 3041274 | A1 | 3/2017 |
| FR | 3046155 | A1 | 6/2017 |
| FR | 3052915 | A1 | 12/2017 |
| JP | 2012059824 | A | 3/2012 |
| JP | 2015061010 | A | 3/2015 |
| JP | 2016066765 | A | 4/2016 |
| KR | 20140118466 | A | 10/2014 |
| KR | 20170018687 | A | 2/2017 |
| KR | 20180010670 | A | 1/2018 |
| KR | 20180114413 | A | 10/2018 |
| TW | 201417339 | A | 5/2014 |
| TW | 201620163 | A | 6/2016 |
| WO | 2010123809 | A2 | 10/2010 |
| WO | 2011045289 | A1 | 4/2011 |
| WO | 2011048318 | A1 | 4/2011 |
| WO | 2012035243 | A1 | 3/2012 |
| WO | 2012156620 | A2 | 11/2012 |
| WO | 2013182969 | A1 | 12/2013 |
| WO | 2015044620 | A1 | 4/2015 |
| WO | 2016079505 | A1 | 5/2016 |
| WO | 2017089676 | A1 | 6/2017 |
| WO | 2017102708 | A1 | 6/2017 |
| WO | WO2017184686 | A | 10/2017 |
| WO | 2017216445 | A1 | 12/2017 |
| WO | 2018091657 | A1 | 5/2018 |
| WO | 2018139866 | A1 | 8/2018 |
| WO | 2018143682 | A1 | 8/2018 |
| WO | 2018159977 | A1 | 9/2018 |
| WO | 2018169243 | A1 | 9/2018 |
| WO | 2019126539 | A | 6/2019 |

OTHER PUBLICATIONS

European Search Report dated September 3, 208 from European Application No. 18159747, 7 pages.
Non-Final Office Action in U.S. Appl. No. 16/226,239, dated Aug. 3, 2020, 15 pages.
Office Action of the Intellectual Property Office of Taiwan in Application 107146241, dated Dec. 26, 2019, 4 pages (with English Translation).
Office Action of the Intellectual Property Office of Taiwan in Application 107146268, dated Feb. 19, 2020, 2 pages (with English Translation).
PCT International Search Report and Written Opinion in PCT/US2018/066862 dated Mar. 14, 2019, 15 pages.
PCT International Search Report and Written Opinion in PCT/US2018/066865 dated Mar. 11, 2019, 10 pages.
PCT International Preliminary Report on Patentability in PCT/US2018/066862 dated Jul. 2, 2020, 10 pages.

* cited by examiner

MONOLITHIC SEGMENTED LED ARRAY ARCHITECTURE WITH ISLANDED EPITAXIAL GROWTH

CROSS REFERENCE TO RELATED APPLICATIONS

This application is a continuation of U.S. application Ser. No. 16/226,288, filed Dec. 19, 2018, which claims the benefit of U.S. Provisional Application Ser. No. 62/608,316 filed on Dec. 20, 2017 and EP Application No. 18159747.7 filed on Mar. 2, 2018, the contents of which are hereby incorporated by reference herein.

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials.

Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, silicon, formed over the substrate, one or more light emitting layers in an active region formed over the n-type layer or layers, and one or more p-type layers doped with, for example, magnesium, formed over the active region. Electrical contacts are formed on the n- and p-type regions.

SUMMARY

A device may include a metal contact between a first isolation region and a second isolation region on a first surface of an epitaxial layer. The device may include a first sidewall and a second sidewall on a second surface of the epitaxial layer distal to the first isolation region and the second isolation region. The device may include a wavelength converting layer on the epitaxial layer between the first sidewall and the second sidewall.

BRIEF DESCRIPTION OF THE DRAWINGS

A more detailed understanding can be had from the following description, given by way of example in conjunction with the accompanying drawings wherein:

FIG. 1O illustrates removing a portion of the dielectric layer to expose an upper surface of the second semiconductor layer;

DETAILED DESCRIPTION OF THE PREFERRED EMBODIMENTS

Figure 1A:
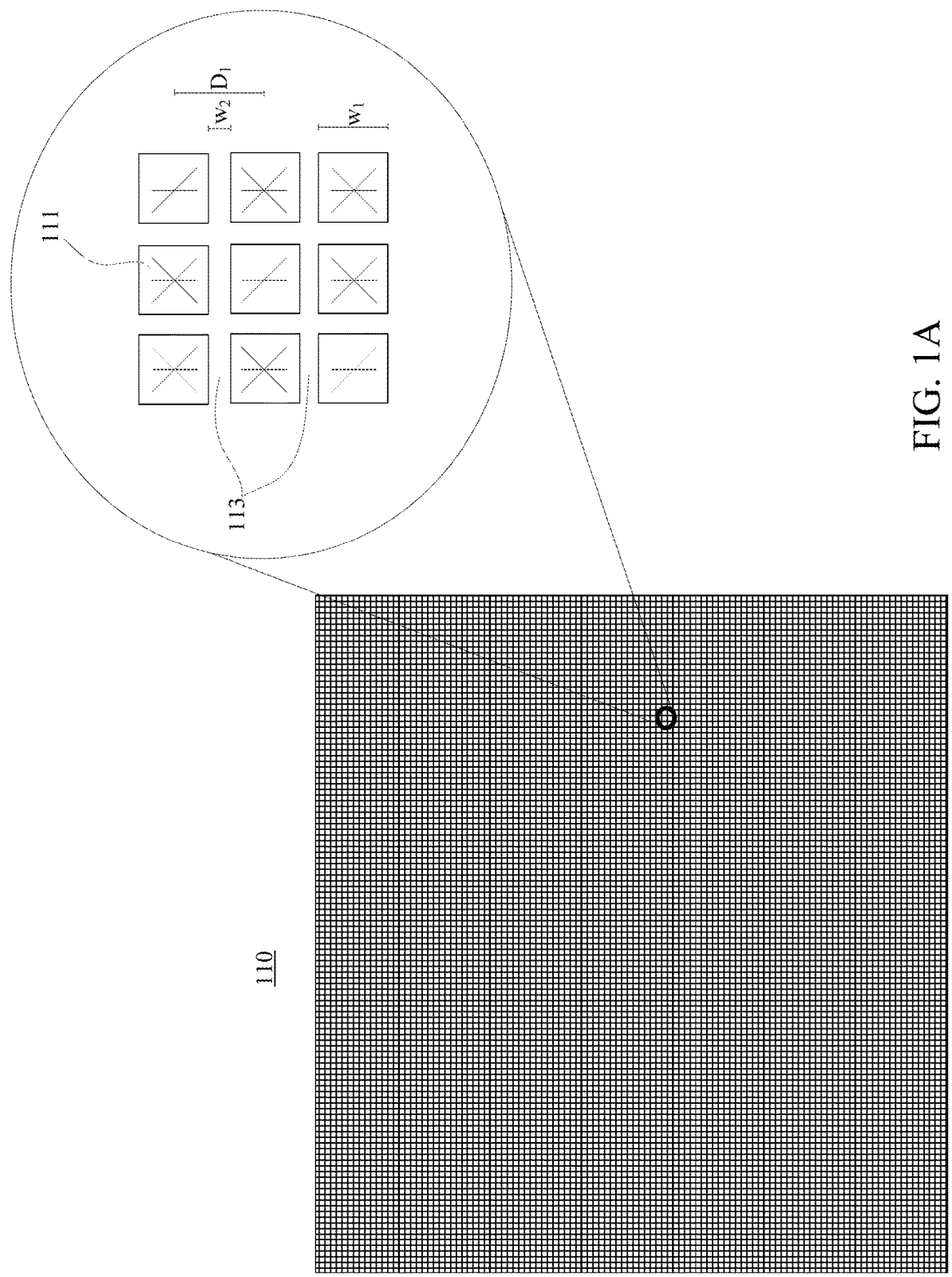
FIG. 1A is a top view illustration of an LED array with an exploded portion.

Examples of different light illumination systems and/or light emitting diode ("LED") implementations will be described more fully hereinafter with reference to the accompanying drawings. These examples are not mutually exclusive, and features found in one example may be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, third, etc. may be used herein to describe various elements, these elements should not be limited by these terms. These terms may be used to distinguish one element from another. For example, a first element may be termed a second element and a second element may be termed a first element without departing from the scope of the present invention. As used herein, the term "and/or" may include any and all combinations of one or more of the associated listed items.

It will be understood that when an element such as a layer, region, or substrate is referred to as being "on" or extending "onto" another element, it may be directly on or extend directly onto the other element or intervening elements may also be present. In contrast, when an element is referred to as being "directly on" or extending "directly onto" another element, there may be no intervening elements present. It will also be understood that when an element is referred to as being "connected" or "coupled" to another element, it may be directly connected or coupled to the other element and/or connected or coupled to the other element via one or more intervening elements. In contrast, when an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper,", "lower," "horizontal" or "vertical" may be used herein to describe a relationship of one element, layer, or region to another element, layer, or region as illustrated in the figures. It will be understood that these terms are intended to encompass different orientations of the device in addition to the orientation depicted in the figures.

Semiconductor light emitting devices (LEDs) or optical power emitting devices, such as devices that emit ultraviolet (UV) or infrared (IR) optical power, are among the most efficient light sources currently available. These devices (hereinafter "LEDs"), may include light emitting diodes, resonant cavity light emitting diodes, vertical cavity laser diodes, edge emitting lasers, or the like. Due to their compact size and lower power requirements, for example, LEDs may be attractive candidates for many different applications. For example, they may be used as light sources (e.g., flash lights and camera flashes) for hand-held battery-powered devices, such as cameras and cell phones. They may also be used, for example, for automotive lighting, heads up display (HUD) lighting, horticultural lighting, street lighting, torch for video, general illumination (e.g., home, shop, office and studio lighting, theater/stage lighting and architectural lighting), augmented reality (AR) lighting, virtual reality (VR) lighting, as back lights for displays, and IR spectroscopy. A single LED may provide light that is less bright than an incandescent light source, and, therefore, multi junction devices or arrays of LEDs (such as monolithic LED arrays, micro LED arrays, etc.) may be used for applications where more brightness is desired or required.

Figure 1B:
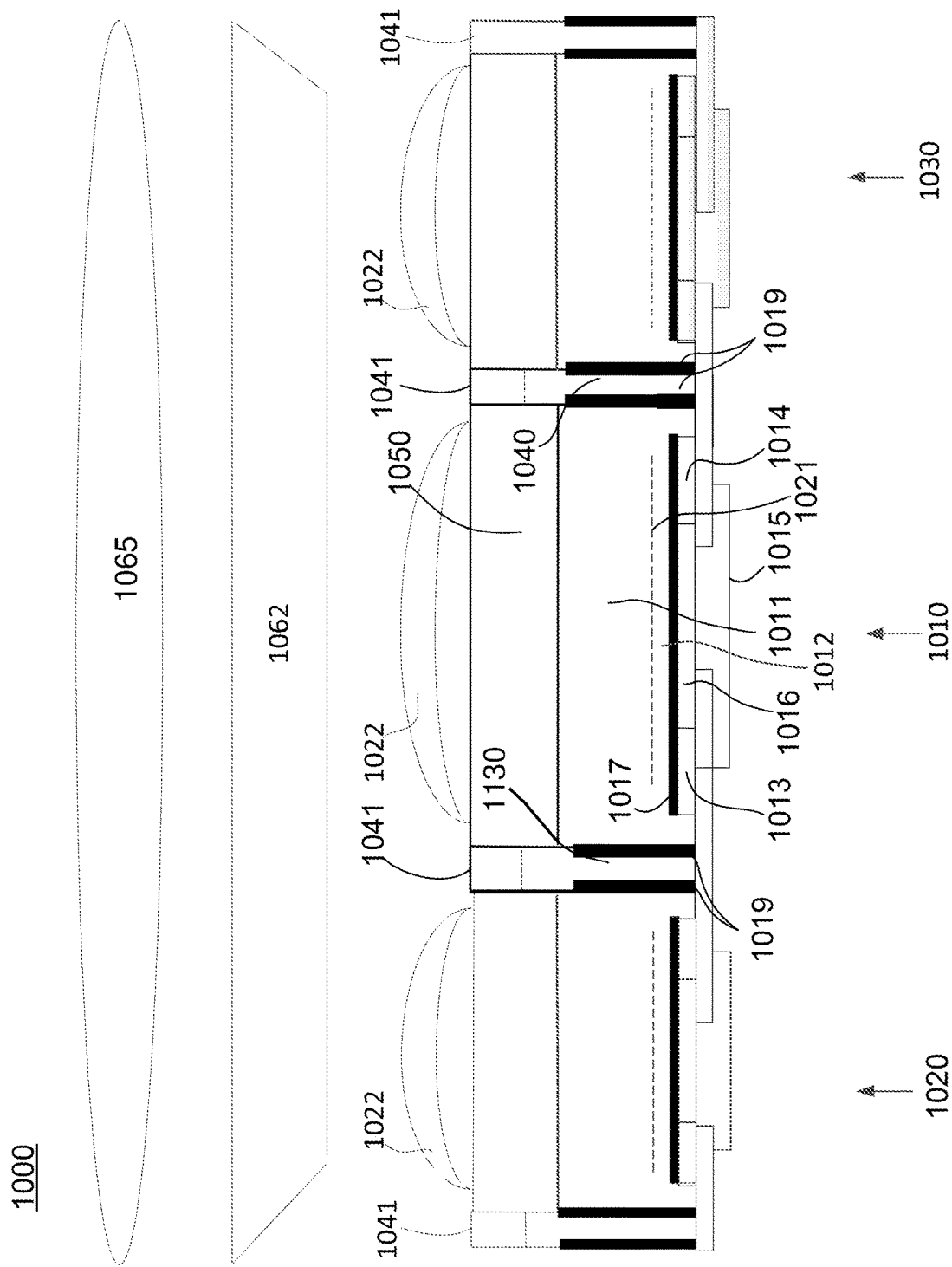
FIG. 1B is a cross sectional illustration of an LED array with trenches.
Figure 1C:
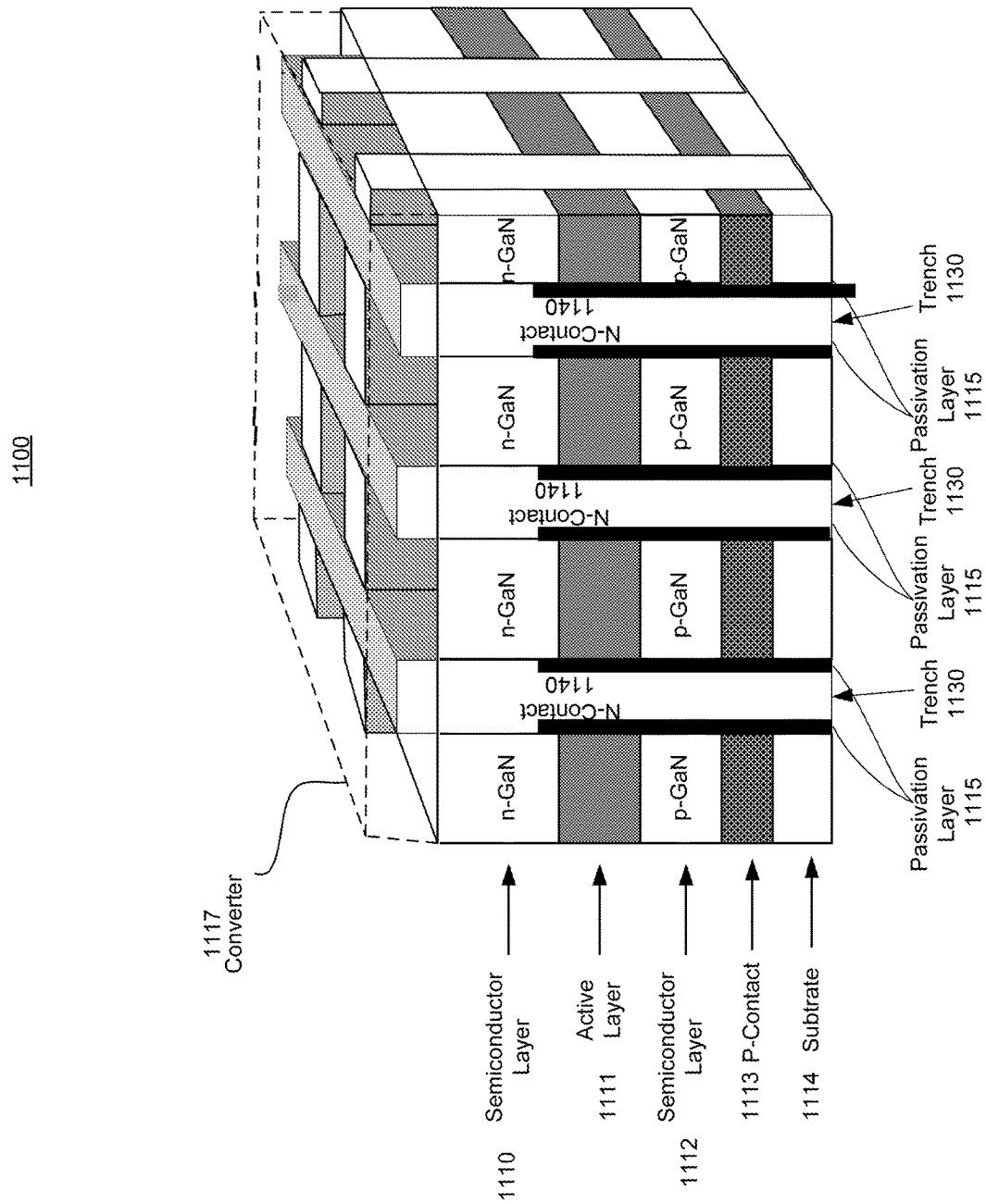
FIG. 1C is a perspective illustration of another LED array with trenches.

According to embodiments of the disclosed subject matter, LED arrays (e.g., micro LED arrays) may include an array of pixels as shown in FIGS. 1A, 1B, and/or 1C. LED arrays may be used for any applications such as those requiring precision control of LED array segments. Pixels in an LED array may be individually addressable, may be addressable in groups/subsets, or may not be addressable. In FIG. 1A, a top view of a LED array 110 with pixels 111 is shown. An exploded view of a 3×3 portion of the LED array 110 is also shown in FIG. 1A. As shown in the 3×3 portion exploded view, LED array 110 may include pixels 111 with a width $w_1$ of approximately 100 µm or less (e.g., 40 µm). The lanes 113 between the pixels may be separated by a width, $w_2$, of approximately 20 µm or less (e.g., 5 µm). The lanes 113 may provide an air gap between pixels or may contain other material, as shown in FIGS. 1B and 1C and further disclosed herein. The distance Di from the center of one pixel 111 to the center of an adjacent pixel 111 may be approximately 120 µm or less (e.g., 45 µm). It will be understood that the widths and distances provided herein are examples only, and that actual widths and/or dimensions may vary.

It will be understood that although rectangular pixels arranged in a symmetric matrix are shown in FIGS. 1A, B and C, pixels of any shape and arrangement may be applied to the embodiments disclosed herein. For example, LED array 110 of FIG. 1A may include, over 10,000 pixels in any applicable arrangement such as a 100×100 matrix, a 200×50 matrix, a symmetric matrix, a non-symmetric matrix, or the like. It will also be understood that multiple sets of pixels, matrixes, and/or boards may be arranged in any applicable format to implement the embodiments disclosed herein.

FIG. 1B shows a cross section view of an example LED array 1000. As shown, the pixels 1010, 1020, and 1030 correspond to three different pixels within an LED array such that a separation sections 1041 and/or n-type contacts 1040 separate the pixels from each other. According to an embodiment, the space between pixels may be occupied by an air gap. As shown, pixel 1010 includes an epitaxial layer 1011 which may be grown on any applicable substrate such as, for example, a sapphire substrate, which may be removed from the epitaxial layer 1011. A surface of the growth layer distal from contact 1015 may be substantially planar or may be patterned. A p-type region 1012 may be located in proximity to a p-contact 1017. An active region 1021 may be disposed adjacent to the n-type region and a p-type region 1012. Alternatively, the active region 1021 may be between a semiconductor layer or n-type region and p-type region 1012 and may receive a current such that the active region 1021 emits light beams. The p-contact 1017 may be in contact with SiO2 layers 1013 and 1014 as well as plated metal (e.g., plated copper) layer 1016. The n type contacts 1040 may include an applicable metal such as Cu. The metal layer 1016 may be in contact with a reflective layer 1015 which may serve as a contact.

Notably, as shown in FIG. 1B, the n-type contact 1040 may be deposited into trenches 1130 created between pixels 1010, 1020, and 1030 and may extend beyond the epitaxial layer 1011. Separation sections 1041 may separate all (as shown) or part of a wavelength converting layer 1050. It will be understood that a LED array may be implemented without such separation sections 1041 or the separation sections 1041 may correspond to an air gap. The separation sections 1041 may be an extension of the n-type contacts 1040, such that, separation sections 1041 are formed from the same material as the n-type contacts 1040 (e.g., copper). Alternatively, the separation sections 1041 may be formed from a material different than the n-type contacts 1040. According to an embodiment, separation sections 1041 may include reflective material. The material in separation sections 1041 and/or the n-type contact 1040 may be deposited in any applicable manner such as, for example, but applying a mesh structure which includes or allows the deposition of the n-type contact 1040 and/or separation sections 1041. Wavelength converting material 1050 may have features/properties similar to wavelength converting layer 205 of FIG. 2A. As noted herein, one or more additional layers may coat the separation sections 1041. Such a layer may be a reflective layer, a scattering layer, an absorptive layer, or any other applicable layer. One or more passivation layers 1019 may fully or partially separate the n-contact 1040 from the epitaxial layer 1011.

The epitaxial layer 1011 may be formed from any applicable material to emit photons when excited including sapphire, SiC, GaN, Silicone and may more specifically be formed from a III-V semiconductors including, but not limited to, AlN, AlP, AlAs, AlSb, GaN, GaP, GaAs, GaSb, InN, InP, InAs, InSb, II-VI semiconductors including, but not limited to, ZnS, ZnSe, CdSe, CdTe, group IV semiconductors including, but not limited to Ge, Si, SiC, and mixtures or alloys thereof. These example semiconductors may have indices of refraction ranging from about 2.4 to about 4.1 at the typical emission wavelengths of LEDs in which they are present. For example, III-Nitride semiconductors, such as GaN, may have refractive indices of about 2.4 at 500 nm, and III-Phosphide semiconductors, such as InGaP, may have refractive indices of about 3.7 at 600 nm. Contacts coupled to the LED device 200 may be formed from a solder, such as AuSn, AuGa, AuSi or SAC solders.

The n-type region may be grown on a growth substrate and may include one or more layers of semiconductor material that include different compositions and dopant concentrations including, for example, preparation layers, and/or layers designed to facilitate removal of the growth substrate. These layers may be n-type or not intentionally doped or may even be p-type device layers. The layers may be designed for particular optical, material, or electrical properties desirable for the light emitting region to efficiently emit light. Similarly, the p-type region 1012 may include multiple layers of different composition, thickness, and dopant concentrations, including layers that are not intentionally doped, or n-type layers. An electrical current may be caused to flow through the p-n junction (e.g., via contacts) and the pixels may generate light of a first wavelength determined at least in part by the bandgap energy of the materials. A pixel may directly emit light (e.g., regular or direct emission LED) or may emit light into a wavelength converting layer 1050 (e.g., phosphor converted LED, "PCLED", etc.) that acts to further modify wavelength of the emitted light to output a light of a second wavelength.

Although FIG. 1B shows an example LED array 1000 with pixels 1010, 1020, and 1030 in an example arrangement, it will be understood that pixels in an LED array may be provided in any one of a number of arrangements. For example, the pixels may be in a flip chip structure, a vertical injection thin film (VTF) structure, a multi junction structure, a thin film flip chip (TFFC), lateral devices, etc. For example, a lateral LED pixel may be similar to a flip chip LED pixel but may not be flipped upside down for direct connection of the electrodes to a substrate or package. A TFFC may also be similar to a flip chip LED pixel but may have the growth substrate removed (leaving the thin film semiconductor layers un-supported). In contrast, the growth substrate or other substrate may be included as part of a flip chip LED.

The wavelength converting layer 1050 may be in the path of light emitted by active region 1021, such that the light emitted by active region 1021 may traverse through one or more intermediate layers (e.g., a photonic layer). According to embodiments, wavelength converting layer 1050 or may not be present in LED array 1000. The wavelength converting layer 1050 may include any luminescent material, such as, for example, phosphor particles in a transparent or translucent binder or matrix, or a ceramic phosphor element, which absorbs light of one wavelength and emits light of a different wavelength. The thickness of a wavelength converting layer 1050 may be determined based on the material used or application/wavelength for which the LED array 1000 or individual pixels 1010, 1020, and 1030 is/are arranged. For example, a wavelength converting layer 1050 may be approximately 20 μm, 50 μm or 200 μm. The wavelength converting layer 1050 may be provided on each individual pixel, as shown, or may be placed over an entire LED array 1000.

Primary optic 1022 may be on or over one or more pixels 1010, 1020, and/or 1030 and may allow light to pass from the active region 101 and/or the wavelength converting layer 1050 through the primary optic. Light via the primary optic may generally be emitted based on a Lambertian distribution pattern such that the luminous intensity of the light emitted via the primary optic 1022, when observed from an ideal diffuse radiator, is directly proportional to the cosine of the angle between the direction of the incident light and the surface normal. It will be understood that one or more properties of the primary optic 1022 may be modified to produce a light distribution pattern that is different than the Lambertian distribution pattern.

Secondary optics which include one or both of the lens 1065 and waveguide 1062 may be provided with pixels 1010, 1020, and/or 1030. It will be understood that although secondary optics are discussed in accordance with the example shown in FIG. 1B with multiple pixels, secondary optics may be provided for single pixels. Secondary optics may be used to spread the incoming light (diverging optics), or to gather incoming light into a collimated beam (collimating optics). The waveguide 1062 may be coated with a dielectric material, a metallization layer, or the like and may be provided to reflect or redirect incident light. In alternative embodiments, a lighting system may not include one or more of the following: the wavelength converting layer 1050, the primary optics 1022, the waveguide 1062 and the lens 1065.

Lens 1065 may be formed from any applicable transparent material such as, but not limited to SiC, aluminum oxide, diamond, or the like or a combination thereof. Lens 1065 may be used to modify a beam of light to be input into the lens 1065 such that an output beam from the lens 1065 will efficiently meet a desired photometric specification. Additionally, lens 1065 may serve one or more aesthetic purpose, such as by determining a lit and/or unlit appearance of the multiple LED devices 200B.

FIG. 1C shows a cross section of a three-dimensional view of a LED array 1100. As shown, pixels in the LED array 1100 may be separated by trenches which are filled to form n-contacts 1140. The pixels may be grown on a substrate 1114 and may include a p-contact 1113, a p-GaN semiconductor layer 1112, an active region 1111, and an n-Gan semiconductor layer 1110. It will be understood that this structure is provided as an example only and one or more semiconductor or other applicable layers may be added, removed, or partially added or removed to implement the disclosure provided herein. A converter material 1117 may be deposited on the semiconductor layer 1110 (or other applicable layer).

Passivation layers 1115 may be formed within the trenches 1130 and n-contacts 1140 (e.g., copper contacts) may be deposited within the trenches 1130, as shown. The passivation layers 1115 may separate at least a portion of the n-contacts 1140 from one or more layers of the semiconductor. According to an implementation, the n-contacts 1140, or other applicable material, within the trenches may extend into the converter material 1117 such that the n-contacts 1140, or other applicable material, provide complete or partial optical isolation between the pixels.

Manufacturing small addressable light LED pixel systems may be costly and difficult. Conventional pick and place techniques available for use with millimeter scale component sizes may be ill-suited for sub-100 micron components that might need to be positioned with micron accuracy. Forming continuous GaN layers for LED pixel systems may result in stress that causes wafer bowing. It may be desirable to form devices without thick continuous GaN layers to reduce wafer bowing and to allow for easier high temperature annealing. Providing wafer scale electrical connection to selectively grown GaN mesas is described in additional detail below.

The following description may include sub-100 μm to 300 μm pixels that may include selectively grown (SAG) and/or etched GaN mesas. The mesas may be partially or completely electrically isolated from one another. By reducing the thickness and/or overall number of continuous GaN layers, integrated film stress and wafer bowing may be reduced when forming multi-section LEDs in a matrix layout. In addition, higher temperature annealing may be used in particular sections of highly strained epitaxial layers to result in specific electrical and optical properties for multi-wavelength emission. The SAG GaN material may be formed on a sapphire substrate, which may be later removed to reduce light loss due to lateral wave guide effects. The SAG GaN material exposed after the removal of the sapphire substrate may be used for phosphor containment.

Figure 1D:
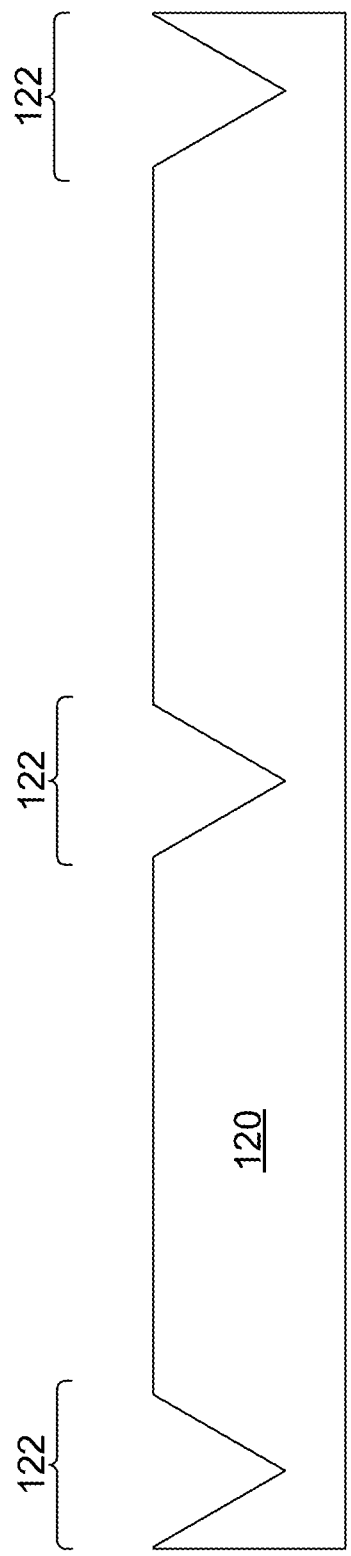
FIG. 1D is a cross-section view illustrating forming trenches in a sapphire substrate.

Referring now to FIG. 1D, a cross-section view illustrating forming trenches 122 in a sapphire substrate 120 is shown. The sapphire substrate 120 may be composed of a crystalline material, such as aluminum oxide, and may be a commercial sapphire wafer. The sapphire substrate 120 may be etched, patterned, or grooved, using conventional patterning and etching techniques to form the trenches 122. In an example, the trenches 122 may be formed using wet etching. In another example, the trenches 122 may be formed by a dry etching technique, such as Reactive Ion Etching (ME) and Inductively Coupled Plasma-Reactive Ion Etching (ICP-RIE). It should be noted that the trenches 122 are shown as a triangular shape in FIG. 1D but may take any desired shape formed by the etching process. The sapphire substrate 120 may be similar to the substrate 1114 as described above with reference to FIG. 1C and may be formed using similar techniques.

Figure 1E:
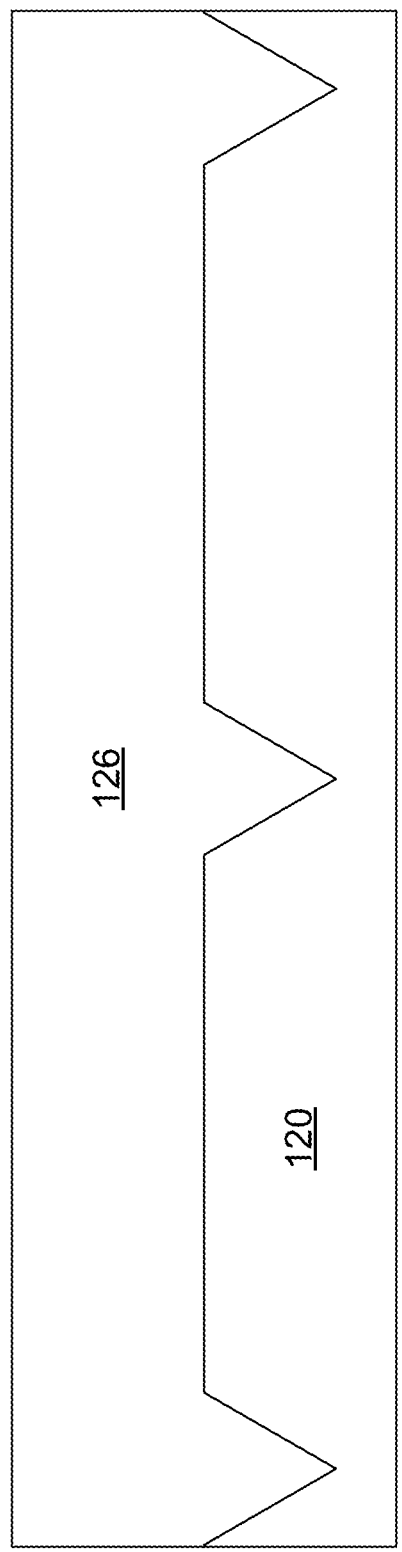
FIG. 1E is a cross-section view illustrating forming a first semiconductor layer in the trenches.

Referring now to FIG. 1E, a cross-section view illustrating forming a first semiconductor layer 126 in the trenches 122 is shown. The first semiconductor layer 126 may be composed of one or more materials optimized for lattice matching and coefficient of thermal expansion matching between the sapphire substrate 120 and subsequent semiconductor layers. The first semiconductor layer 126 may be composed of a semiconductor material, a metal oxide, a metal nitride, or a combination of a metal and semiconductor materials. Examples of materials that may be used for the first semiconductor layer 126 include, but are not limited to, SiC, $Al_2O_1$, GaN, AlN, and AlGaN. The first semiconductor layer 126 may be doped with an n-type dopant such as Si or a p-type dopant such as Mg. The concentration of dopant in the first semiconductor layer 126 may not have a large effect on the index of refraction of the first semiconductor layer 126, but too large of a dopant concentration may strain the crystal structure of the first semiconductor layer 126. This may adversely impact the quality of the subsequent semiconductor layers grown over the first semiconductor layer 126. In an example, the first semiconductor layer 126 may be doped with Si to a nominally constant concentration of $3e18$ $cm^{-3}$ to $5e19$ $cm^{-3}$. The first semiconductor layer 126 may also have a graded dopant concentration.

The first semiconductor layer 126 may be formed using conventional deposition techniques, such as metal-organic chemical vapor deposition (MOCVD), molecular beam epitaxy (MBE), or other epitaxial techniques. In an epitaxial deposition process, chemical reactants provided by one or more source gases are controlled and the system parameters are set so that depositing atoms arrive at a deposition surface with sufficient energy to move around on the surface and orient themselves to the crystal arrangement of the atoms of the deposition surface. The temperature at which the first semiconductor layer 126 is grown may influence the surface morphology of the semiconductor layers grown over the nucleation layer. The first semiconductor layer 126 may be grown and/or annealed at a high temperature, for example between 900° C. and 1200° C. In another example, the first semiconductor layer 126 may be grown between 1080° C. and 1165° C.

The thickness, composition, dopant concentration, and fabrication temperature of the first semiconductor layer 126 may each selected such that the first semiconductor layer 126 both enhances a light extraction of the device by having an index of refraction close to that of the subsequent semiconductor layers and causes favorable surface properties in the subsequent semiconductor layers.

The first semiconductor layer 126 may be composed of any Group III-V semiconductors, including binary, ternary, and quaternary alloys of gallium, aluminum, indium, and nitrogen, also referred to as III-nitride materials. For example, the first semiconductor layer 126 may be composed of III-V semiconductors including but not limited to AlN, AlP, AlAs, AlSb, GaN, GaP, GaAs, GaSb, InN, InP, InAs, InSb, II-VI semiconductors including but not limited to ZnS, ZnSe, CdSe, CdTe, group IV semiconductors including but not limited to Ge, Si, SiC, and mixtures or alloys thereof. These semiconductors may have indices of refraction ranging from about 2.4 to about 4.1 at the typical emission wavelengths of LEDs in which they are present. For example, III-nitride semiconductors, such as GaN, may have refractive indices of about 2.4 at 500 nm, and III-phosphide semiconductors, such as InGaP, may have refractive indices of about 3.7 at 600 nm. In an example, the first semiconductor layer 126 may be composed of GaN.

The first semiconductor layer 126 may be formed using conventional deposition techniques, such as MOCVD, MBE, or other epitaxial techniques. The first semiconductor layer 126 may be doped with n-type dopants.

Figure 1F:
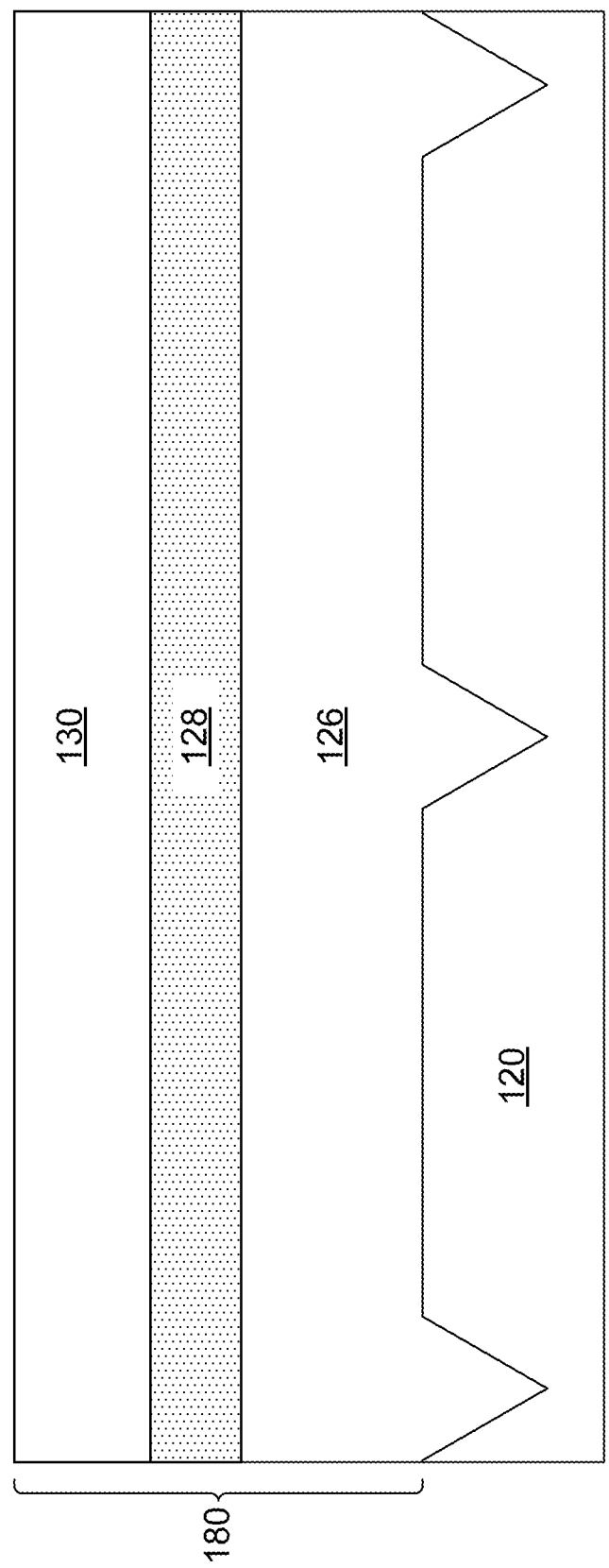
FIG. 1F is a cross-section view illustrating forming an active region and a second semiconductor layer on the first semiconductor layer.

Referring now to FIG. 1F, a cross-section view illustrating forming an active region 128 and a second semiconductor layer 130 on the first semiconductor layer 126 is shown. The second semiconductor layer 130 and the active region 128 may be composed of any Group III-V semiconductors, including binary, ternary, and quaternary alloys of gallium, aluminum, indium, and nitrogen, also referred to as III-nitride materials. For example, the second semiconductor layer 130 and the active region 128 may be composed of III-V semiconductors including but not limited to AlN, AlP, AlAs, AlSb, GaN, GaP, GaAs, GaSb, InN, InP, InAs, InSb, II-VI semiconductors including but not limited to ZnS, ZnSe, CdSe, CdTe, group IV semiconductors including but not limited to Ge, Si, SiC, and mixtures or alloys thereof. These semiconductors may have indices of refraction ranging from about 2.4 to about 4.1 at the typical emission wavelengths of LEDs in which they are present. For example, III-nitride semiconductors, such as GaN, may have refractive indices of about 2.4 at 500 nm, and III-phosphide semiconductors, such as InGaP, may have refractive indices of about 3.7 at 600 nm. In an example, the second semiconductor layer 130 and the active region 128 may be composed of GaN.

The second semiconductor layer 130 and the active region 128 may be formed using conventional deposition techniques, such as MOCVD, MBE, or other epitaxial techniques. The active region 128 and the second semiconductor layer 130 may be formed along with the first semiconductor layer 126 or may be formed separately. The active region 128 and the second semiconductor layer 130 may be composed of a similar semiconductor material as the first semiconductor layer 126 or their composition may vary.

The second semiconductor layer 130 may be doped with p-type dopants. Accordingly, the active region 128 may be a p-n diode junction associated with the interface of the first semiconductor layer 126 and the second semiconductor layer 130. Alternatively, the active region 128 may include one or more semiconductor layers that are doped n-type, doped p-type, or are undoped. The active region 128 may emit light upon application of a suitable voltage through the first semiconductor layer 126 and the second semiconductor layer 130. In alternative implementations, the conductivity types of the first semiconductor layer 126 and the second semiconductor layer 130 may be reversed. That is, the first semiconductor layer 126 may be a p-type layer and the second semiconductor layer 130 may be an n-type layer. The first semiconductor layer 126, the active region 128, and the second semiconductor layer 130 may be collectively referred to as an epitaxial layer 180. The epitaxial layer 180 may be similar to the epitaxial layer 1011 as described above with reference to FIG. 1B and may be formed using similar techniques.

Figure 1G:
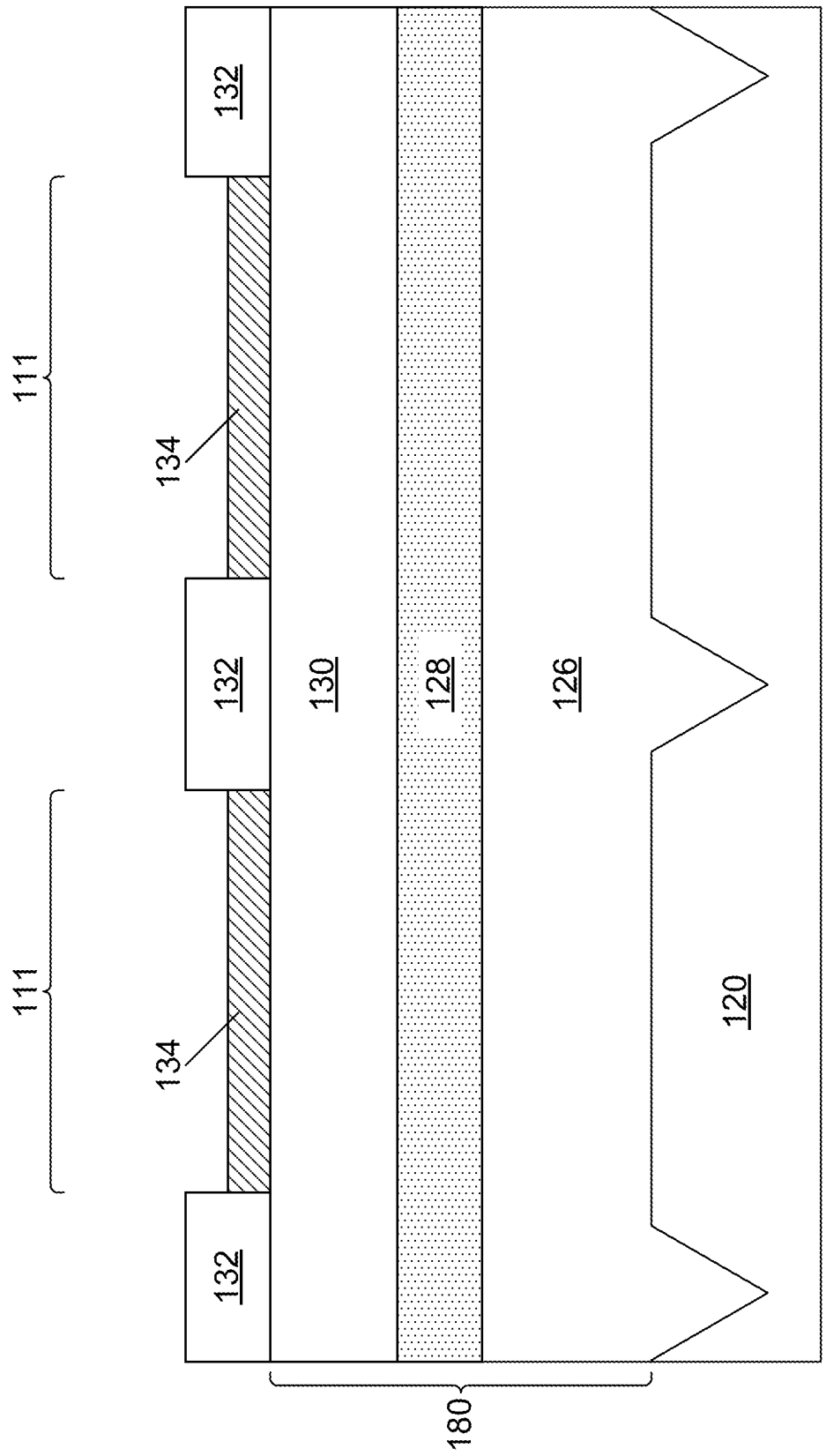
FIG. 1G is a cross-section view illustrating forming isolation regions and metal contacts on the second semiconductor layer.

Referring now to FIG. 1G, a cross-section view illustrating forming isolation regions 132 and metal contacts 134 on the second semiconductor layer 130 is shown. The isolation regions 132 may be composed of a dielectric material, such as, an oxide, a nitride, or an oxynitride. The isolation regions 132 may be formed using a conventional deposition technique, such as, for example, CVD, plasma enhanced chemical vapor deposition (PECVD), MOCVD, atomic layer deposition (ALD), evaporation, reactive sputtering, chemical solution deposition, spin-on deposition, or other like processes. The isolation regions 132 may be patterned and etched using conventional techniques. The metal contacts 134 may be composed of one or more layers of a conductive metal or metal alloy, such as, gold, silver, copper. The metal contacts 134 may be formed using a conventional deposition technique, such as, for example, CVD, PECVD, MOCVD, ALD, evaporation, reactive sputtering, chemical solution deposition, plating, spin-on deposition, or other like processes. The metal contacts 134 may be patterned and etched using conventional techniques. The isolation regions 132 may be formed so they are located above the first semiconductor layer 126 formed in the trenches 122. The isolation regions 132 may define the pixels 111 as described above with reference to FIG. 1A.

Figure 1H:
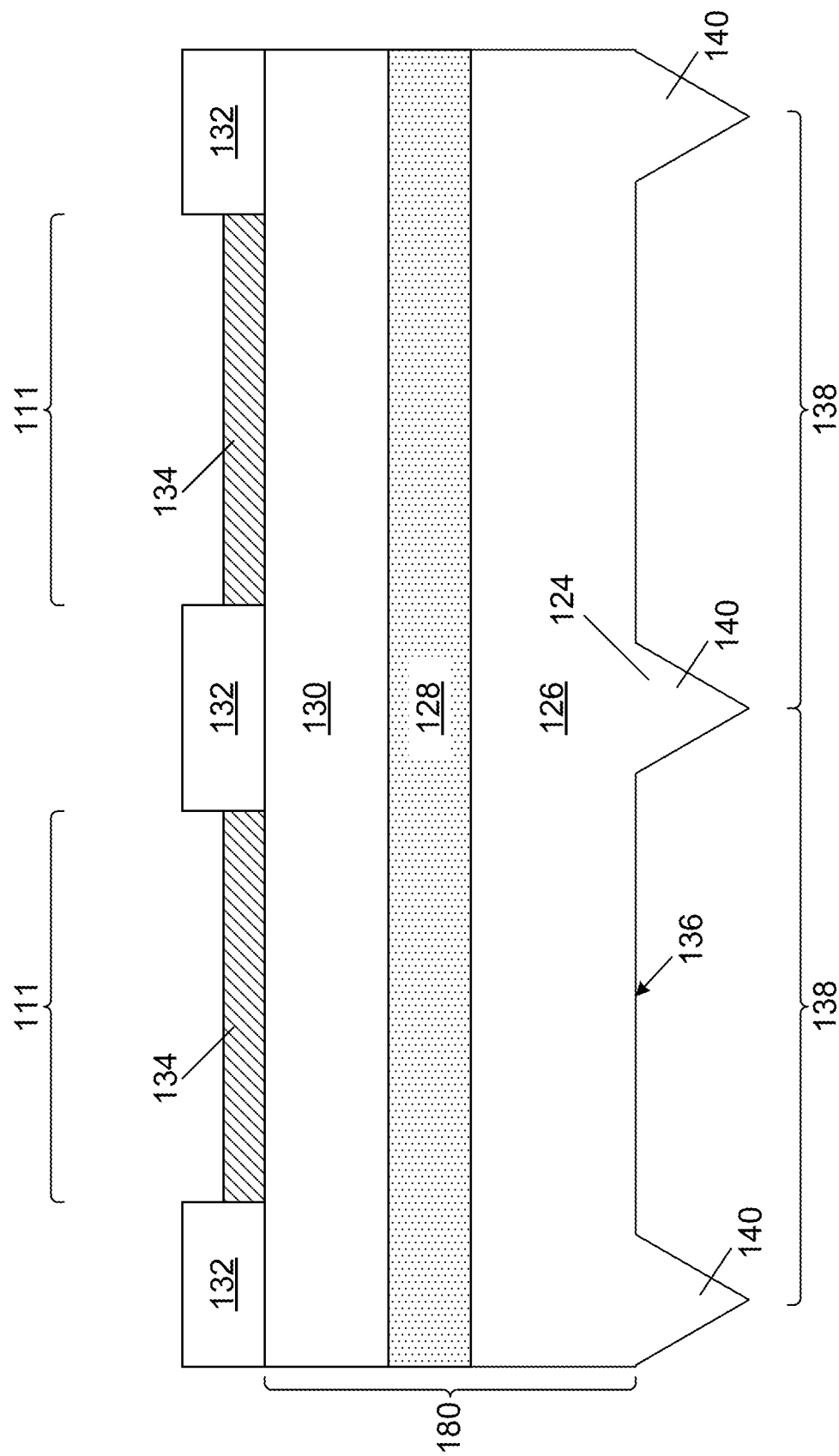
FIG. 1H is a cross-section view illustrating removing the sapphire substrate.

Referring now to FIG. 1H, a cross-section view illustrating removing the sapphire substrate 120 is shown. The sapphire substrate 120 may be removed by a conventional process such as grinding, chemical mechanical polishing (CMP), or laser lift-off. In an example, the sapphire substrate 120 may be removed selective to the first semiconductor layer 126 and the first semiconductor layer 126. The removal of the sapphire substrate 120 may expose a bottom surface 136 of the first semiconductor layer 126 and one or more sidewalls 140 composed of the first semiconductor layer 126. The one or more sidewalls 140 may form one or more protrusions 124. The one or more sidewalls 140 of the first semiconductor layer 126 may extend below the bottom surface 136 of the first semiconductor layer 126. Removing the sapphire substrate 120 may form a well 138 bounded by the one or more sidewalls 140 and the bottom surface 136 of the first semiconductor layer 126. In an example, the bottom surface 136 may be roughened after it is exposed.

Figure 1I:
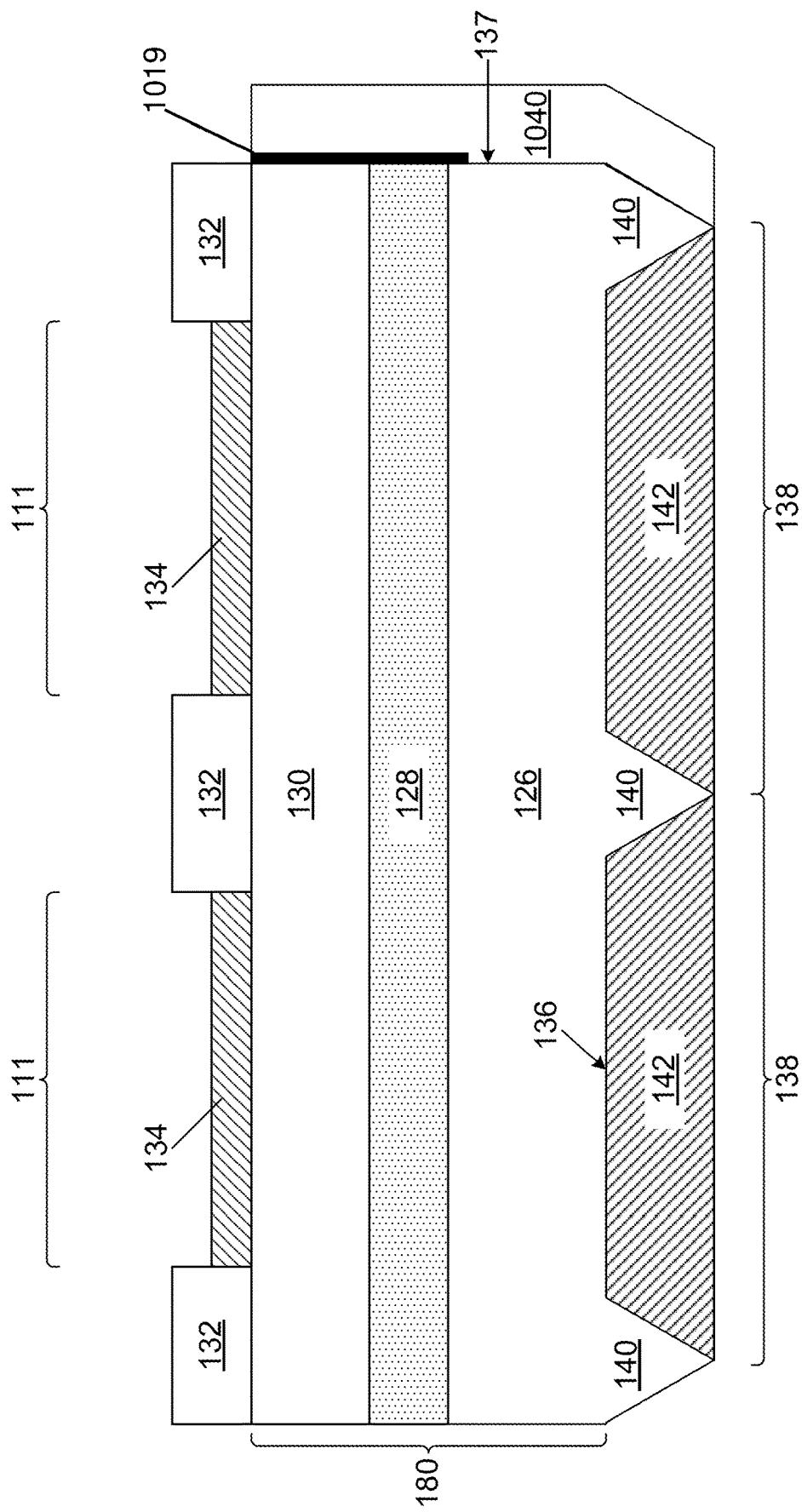
FIG. 1I is a cross-section view illustrating forming a wavelength converting layer within wells.

Referring now to FIG. 1I, a cross-section view illustrating forming a wavelength converting layer 142 within the wells 138 is shown. The wavelength converting layer 142 may be formed on the bottom surface 136 of the first semiconductor layer 126 between the sidewalls 140.

The wavelength converting layer 142 may be composed of elemental phosphor or compounds thereof. The wavelength converting layer 142 may be formed using a conventional deposition technique, such as, for example, CVD, plasma enhanced chemical vapor deposition (PECVD), MOCVD, atomic layer deposition (ALD), evaporation, reactive sputtering, chemical solution deposition, spin-on deposition, or other like processes. The wavelength converting layer 142 may contain one or more phosphors. Phosphors are luminescent materials that may absorb an excitation energy (usually radiation energy), and then emit the absorbed energy as radiation of a different energy than the initial excitation energy. The phosphors may have quantum efficiencies near 100%, meaning nearly all photons provided as excitation energy may be reemitted by the phosphors. The phosphors may also be highly absorbent. Because the light emitting active region 128 may emit light directly into the highly efficient, highly absorbent wavelength converting layer 142, the phosphors may efficiently extract light from the device. The phosphors used in the wavelength converting layer 142 may include, but are not limited to any conventional green, yellow, and red emitting phosphors.

The wavelength converting layer 142 may be formed by depositing grains of phosphor on the bottom surface 136 of the first semiconductor layer 126. The phosphor grains may be in direct contact with the first semiconductor layer 126, such that light emitted from the active region 128 may be directly coupled to the phosphor grains. Although not shown in FIG. 1I, an optical coupling medium may be provided to hold the phosphor grains in place. The optical coupling medium may be selected to have a refractive index that is as close as possible without significantly exceeding the index of refraction of the first semiconductor layer 126. For most efficient operation, no lossy media may be included between the first semiconductor layer 126, the phosphor grains of the wavelength converting layer 142, and the optical coupling medium.

The phosphor grains may have a grain size between 0.1 μm and 20 μm. The phosphor grains may be applied by, for example, electrophoretic deposition, spin coating, spray coating, screen printing, or other printing techniques to form the wavelength converting layer 142. In techniques such as spin coating or spray coating, the phosphor may be disposed in a slurry with an organic binder, which may then evaporate after deposition of the slurry by, for example, heating. Optionally, the optical coupling medium may then be applied. Phosphor particles may be nanoparticles themselves (i.e., particles ranging from 100 nm to 1000 nm in size). Spherical phosphor particles, typically produced by spray pyrolysis methods or other methods can be applied, yielding a layer with a high package density which provides advantageous scattering properties. Also, phosphors particles may be coated, for example with a material with a band gap larger than the light emitted by the phosphor, such as $SiO2$, $Al_2O_3$, $MePO_4$ or -polyphosphate, or other suitable metal oxides.

The wavelength converting layer 142 may be a ceramic phosphor, rather than a phosphor powder. A ceramic phosphor may be formed by heating a powder phosphor at high pressure until the surface of the phosphor particles begin to soften and melt. The partially-melted particles may stick together to form a rigid agglomerate of particles. Uniaxial or isostatic pressing steps and vacuum sintering of the pre-formed "green body" may be necessary to form a polycrystalline ceramic layer. The translucency of the ceramic phosphor (i.e., the amount of scattering it produces) may be controlled from high opacity to high transparency by adjusting the heating or pressing conditions, the fabrication method, the phosphor particle precursor used, and the suitable crystal lattice of the phosphor material. Besides phosphor, other ceramic forming materials such as alumina may be included, for example to facilitate formation of the ceramic or to adjust the refractive index of the ceramic.

The wavelength converting layer 142 may be composed of a mixture of silicone and phosphor particles. In this example, the wavelength converting layer 142 may be diced from plates and placed on the bottom surface 136 of the first semiconductor layer 126.

In another example, a PSS substrate having a preformed pattern of raised and recessed areas may be used to form SAG and etched GaN mesas. In yet another example, the first semiconductor layer 126 may be planarized after it is formed in the trenches 122, such that an upper surface of the sapphire substrate 120 is exposed before the first semiconductor layer 126 is formed. Accordingly, the first semiconductor layer 126 may be formed directly on the first semiconductor layer 126 and an upper surface of the sapphire substrate 120. When the sapphire substrate 120 is removed, the wavelength converting layer 142 may be formed directly on a lower surface of the first semiconductor layer 126 and may be bounded by the sidewalls 140 of the first semiconductor layer 126.

As shown in FIG. 1I, one or more n-type contacts 1040 may be formed on a sidewall 137 of the epitaxial layer 180 and may extend to the one or more sidewalls 140. The one or more passivation layers 1019 may fully or partially separate one or more n-type contacts 1040 from the epitaxial layer 180 and the one or more sidewalls 140.

Figure 1J:
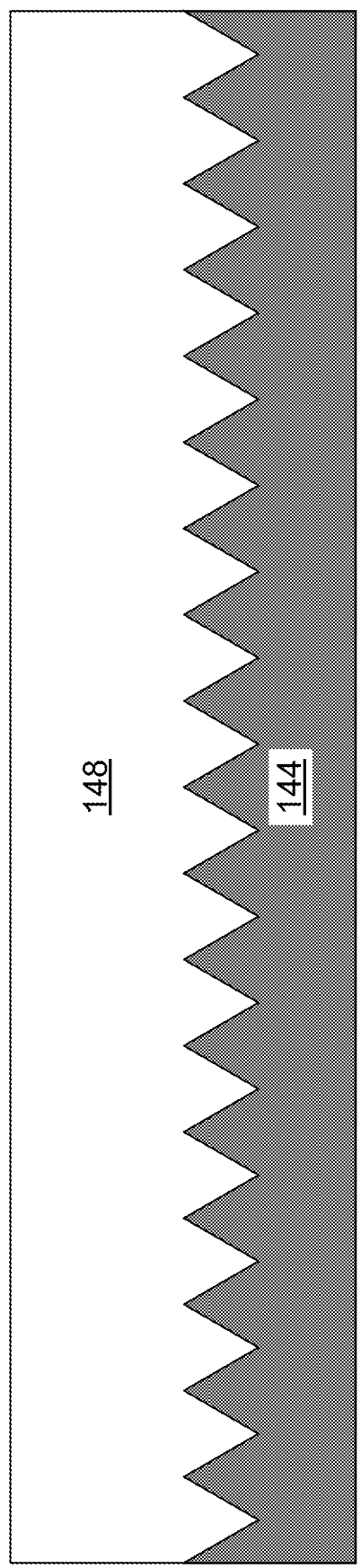
FIG. 1J is a cross-section view illustrating forming a first semiconductor layer on a patterned sapphire substrate (PSS) substrate.

Referring now to FIG. 1J, a cross-section view illustrating forming a first semiconductor layer 148 on a PSS substrate 144 is shown. The PSS substrate 144 may be composed of a crystalline material, such as aluminum oxide, and may be a commercial sapphire wafer. The PSS substrate 144 may be etched, patterned, or grooved, using conventional patterning and etching techniques. Recessed areas in the PSS substrate 144 may be formed by a dry etching technique, such as RIE and ICP-RIE. The PSS substrate 144 may be similar to the substrate 1114 as described above with reference to FIG. 1C and may be formed using similar techniques.

The first semiconductor layer 148 may be formed in the recesses of the PSS substrate 144. The first semiconductor layer 148 may be composed of one or more materials optimized for lattice matching and coefficient of thermal expansion matching between the PSS substrate 144 and subsequent semiconductor layers. The first semiconductor layer 148 may be composed of a semiconductor material, a metal oxide, a metal nitride, or a combination of a metal and semiconductor materials. Examples of materials that may be used for the first semiconductor layer 148 include, but are not limited to, SiC, $Al_2O_1$, GaN, AlN, and AlGaN. The first semiconductor layer 148 may be doped with an n-type dopant such as Si or a p-type dopant such as Mg. The concentration of dopant in the first semiconductor layer 148 may not have a large effect on the index of refraction of the first semiconductor layer 148, but too large of a dopant concentration may strain the crystal structure of the first semiconductor layer 148. This may adversely impact the quality of the subsequent semiconductor layers grown over the first semiconductor layer 148. In an example, the first semiconductor layer 148 may be doped with Si to a nominally constant concentration of 3e18 cm' to 5e19 cm'. The first semiconductor layer 148 may also have a graded dopant concentration.

The first semiconductor layer 148 may be formed using conventional deposition techniques, such as MOCVD, MBE, or other epitaxial techniques. In an epitaxial deposition process, chemical reactants provided by one or more source gases are controlled and the system parameters are set so that depositing atoms arrive at a deposition surface with sufficient energy to move around on the surface and orient themselves to the crystal arrangement of the atoms of the deposition surface. The temperature at which the first semiconductor layer 148 is grown may influence the surface morphology of the semiconductor layers grown over the nucleation layer. The first semiconductor layer 148 may be grown and/or annealed at a high temperature, for example between 900° C. and 1200° C. In another example, the first semiconductor layer 148 may be grown between 1080° C. and 1165° C.

The thickness, composition, dopant concentration, and fabrication temperature of the first semiconductor layer 148 may each selected such that the first semiconductor layer 148 both enhances a light extraction of the device by having an index of refraction close to that of the subsequent semiconductor layers and causes favorable surface properties in the subsequent semiconductor layers.

The first semiconductor layer 148 may be composed of any Group III-V semiconductors, including binary, ternary, and quaternary alloys of gallium, aluminum, indium, and nitrogen, also referred to as III-nitride materials. For example, the first semiconductor layer 148 may be composed of III-V semiconductors including but not limited to AlN, AlP, AlAs, AlSb, GaN, GaP, GaAs, GaSb, InN, InP, InAs, InSb, II-VI semiconductors including but not limited to ZnS, ZnSe, CdSe, CdTe, group IV semiconductors including but not limited to Ge, Si, SiC, and mixtures or alloys thereof. These semiconductors may have indices of refraction ranging from about 2.4 to about 4.1 at the typical emission wavelengths of LEDs in which they are present. For example, III-nitride semiconductors, such as GaN, may have refractive indices of about 2.4 at 500 nm, and III-phosphide semiconductors, such as InGaP, may have refractive indices of about 3.7 at 600 nm. In an example, the first semiconductor layer 148 may be composed of GaN.

The first semiconductor layer 148 may be formed using conventional deposition techniques, such as MOCVD, MBE, or other epitaxial techniques. The first semiconductor layer 148 may be doped with n-type dopants.

Figure 1K:
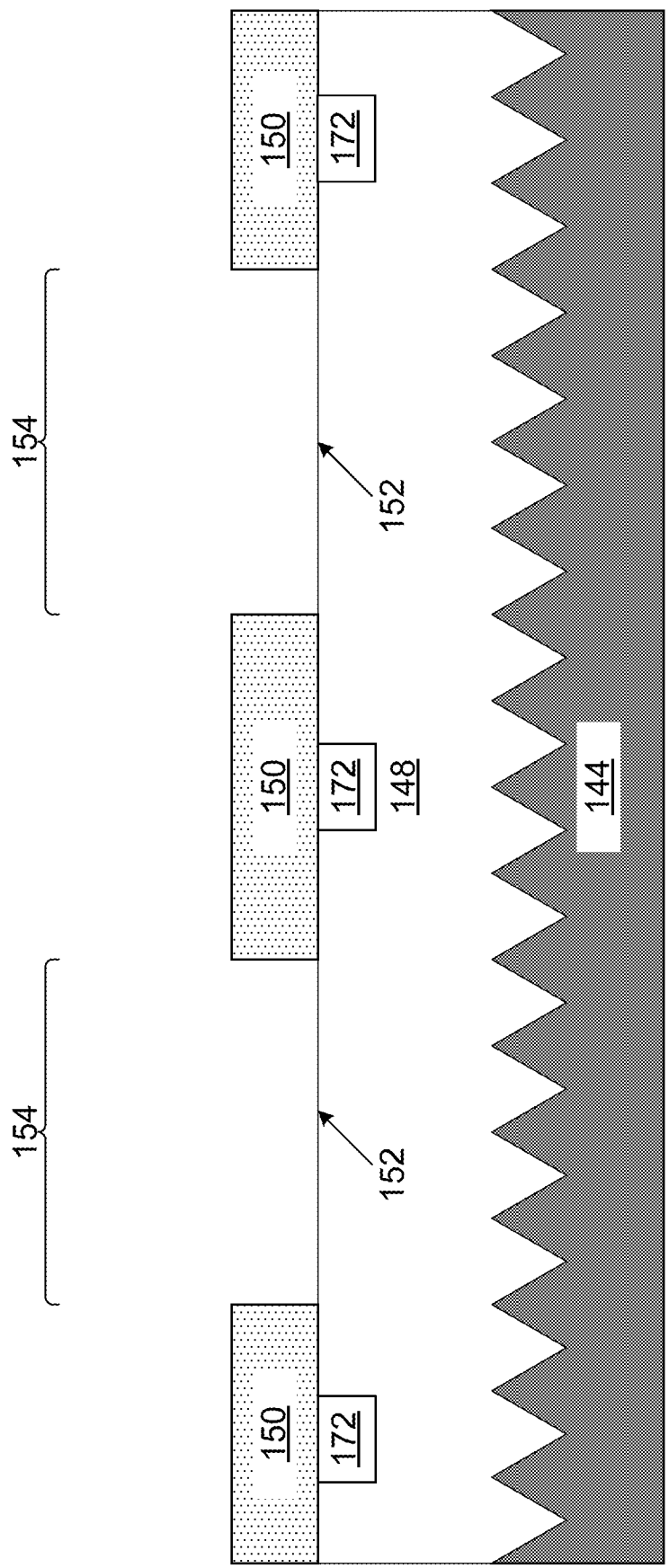
FIG. 1K is a cross-section view illustrating forming isolation regions on an upper surface the first semiconductor layer.

Referring now to FIG. 1K, a cross-section view illustrating forming isolation regions 150 on an upper surface 152 the first semiconductor layer 148 is shown. The isolation regions 150 may be composed of a dielectric material, such as, for example an oxide, a nitride, or an oxynitride. The isolation regions 150 may be formed using a conventional deposition technique, such as, for example, CVD, plasma enhanced chemical vapor deposition (PECVD), MOCVD, atomic layer deposition (ALD), evaporation, reactive sputtering, chemical solution deposition, spin-on deposition, or other like processes. The isolation regions 150 may be patterned and etched using conventional techniques. The isolation regions 150 may be formed such that portions of the upper surface 152 of the first semiconductor layer 148 are exposed in openings 154. A first contact 172 may be formed within the first semiconductor layer 148 prior to deposition of the isolation regions 150. The first contact 172 may be formed by etching a trench in the first semiconductor layer 148 and filling it with one or more layers of a conductive metal or metal alloy, such as, gold, silver, copper. The first contact 172 may be formed using a conventional deposition technique, such as, for example, CVD, PECVD, MOCVD, ALD, evaporation, reactive sputtering, chemical solution deposition, plating, spin-on deposition, or other like processes.

Figure 1L:
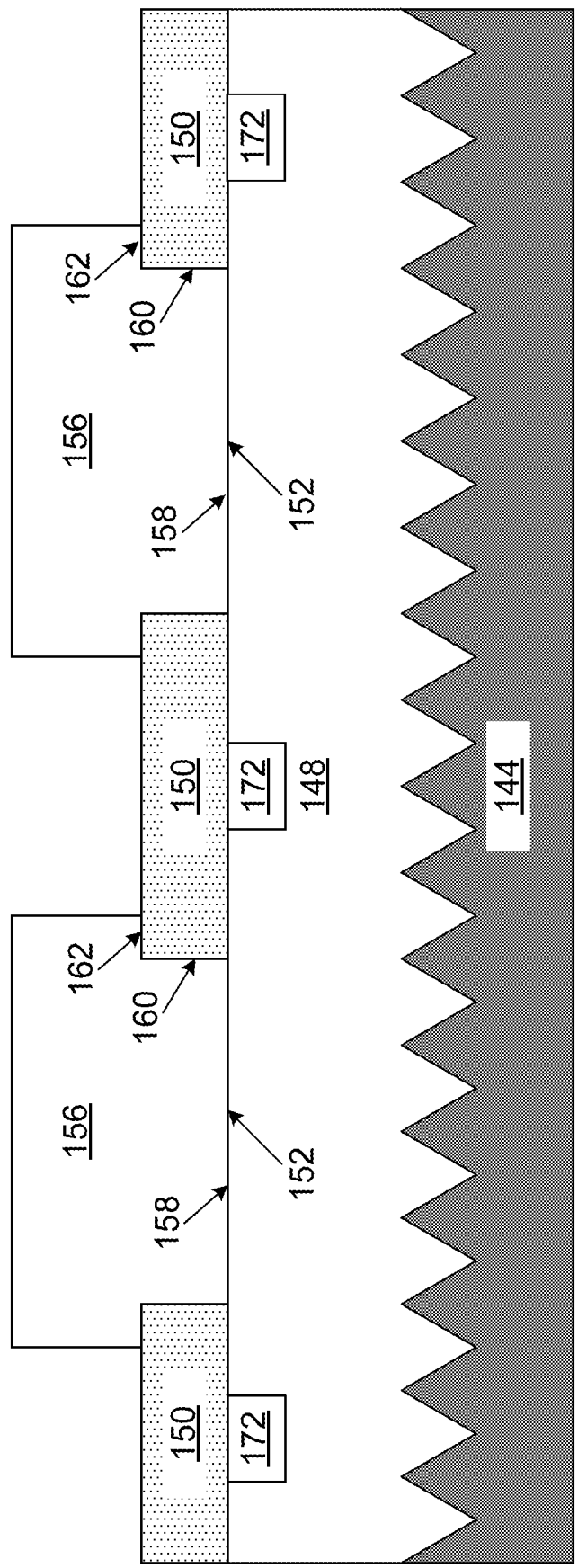
FIG. 1L is a cross-section view illustrating forming mesas on the first semiconductor layer and the isolation regions.

Referring now to FIG. 1L, a cross-section view illustrating forming mesas 156 on the first semiconductor layer 148 and the isolation regions 150 is shown. The mesas 156 may be formed such that a first portion 158 of the mesas 156 is in contact with the upper surface 152 of the first semiconductor layer 148, a second portion 160 of the mesas 156 is in contact with a sidewall of the isolation regions 150, and a third portion 162 of the mesas 156 is in contact with an upper surface of the isolation regions 150.

The mesas 156 may be composed of any Group III-V semiconductors, including binary, ternary, and quaternary alloys of gallium, aluminum, indium, and nitrogen, also referred to as III-nitride materials. For example, the mesas 156 may be composed of III-V semiconductors including but not limited to AlN, AlP, AlAs, AlSb, GaN, GaP, GaAs, GaSb, InN, InP, InAs, InSb, II-VI semiconductors including but not limited to ZnS, ZnSe, CdSe, CdTe, group IV semiconductors including but not limited to Ge, Si, SiC, and mixtures or alloys thereof. These semiconductors may have indices of refraction ranging from about 2.4 to about 4.1 at the typical emission wavelengths of LEDs in which they are present. For example, III-nitride semiconductors, such as GaN, may have refractive indices of about 2.4 at 500 nm, and III-phosphide semiconductors, such as InGaP, may have refractive indices of about 3.7 at 600 nm. In an example, the mesas 156 may be composed of GaN.

The mesas 156 may be formed using conventional deposition techniques, such as MOCVD, MBE, or other epitaxial techniques. The mesas 156 may be formed along with the first semiconductor layer 126 and an active region to form an epitaxial layer 1011 as described above with reference to FIG. 1B, or they may be formed separately. The mesas 156 may be composed of a similar semiconductor material as the first semiconductor layer 148 or their composition may vary.

Figure 1M:
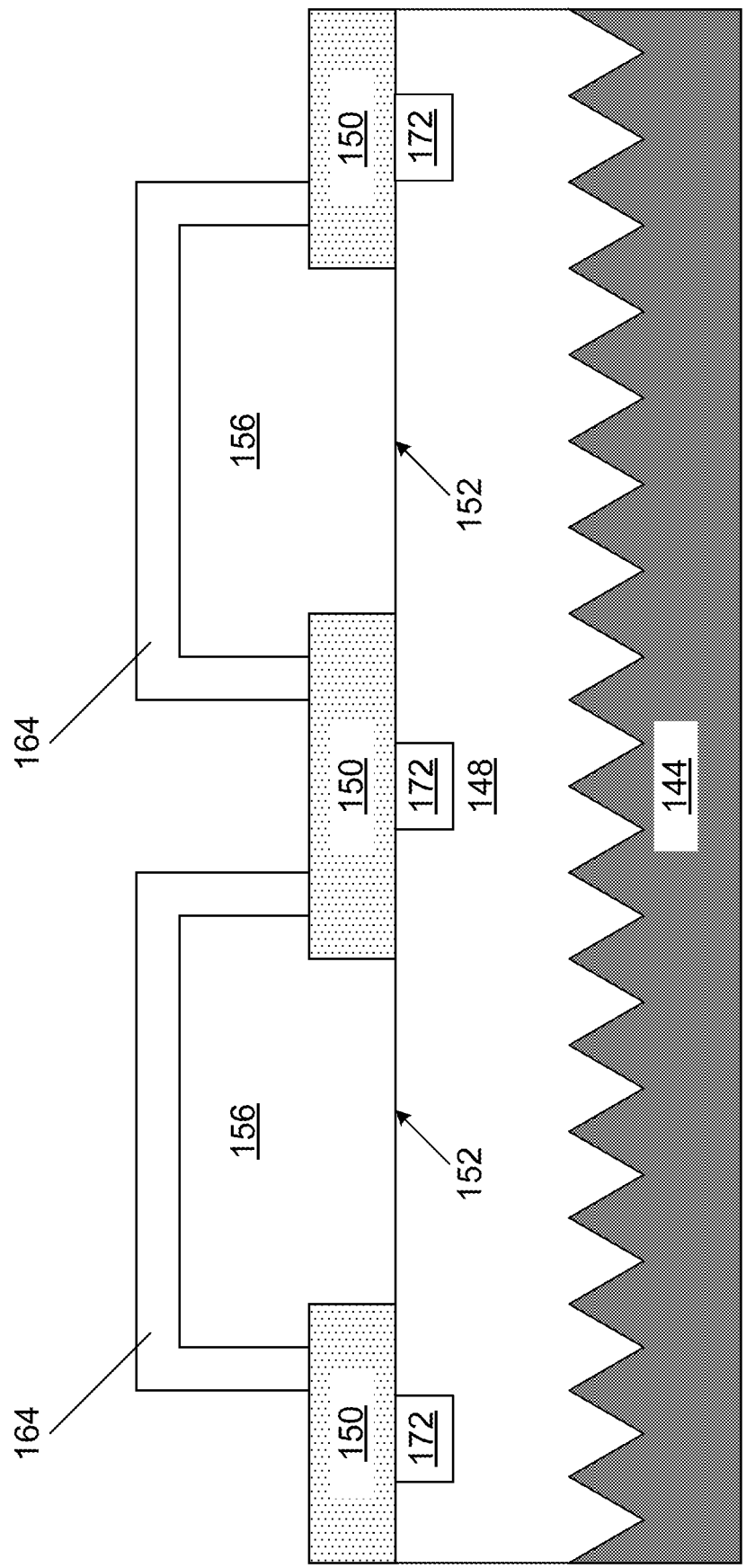
FIG. 1M is a cross-section view illustrating forming a second semiconductor layer on the mesas.

Referring now to FIG. 1M, a cross-section view illustrating forming a second semiconductor layer 164 on the mesas 156 is shown. The second semiconductor layer 164 may be selectively grown on the mesas 156 using a conventional deposition process, such as MOCVD, MBE, or other epitaxial techniques.

The second semiconductor layer 164 may be composed of any Group III-V semiconductors, including binary, ternary, and quaternary alloys of gallium, aluminum, indium, and nitrogen, also referred to as III-nitride materials. For example, the second semiconductor layer 164 may be composed of III-V semiconductors including but not limited to AlN, AlP, AlAs, AlSb, GaN, GaP, GaAs, GaSb, InN, InP, InAs, InSb, II-VI semiconductors including but not limited to ZnS, ZnSe, CdSe, CdTe, group IV semiconductors including but not limited to Ge, Si, SiC, and mixtures or alloys thereof. These semiconductors may have indices of refraction ranging from about 2.4 to about 4.1 at the typical emission wavelengths of LEDs in which they are present. For example, III-nitride semiconductors, such as GaN, may have refractive indices of about 2.4 at 500 nm, and III-phosphide semiconductors, such as InGaP, may have refractive indices of about 3.7 at 600 nm. In an example, the second semiconductor layer 164 may be composed of AlGaN.

The second semiconductor layer 164 may be formed along with the mesas 156 or may be formed separately. The mesas 156 and the second semiconductor layer 164 may be composed of a similar semiconductor material as the first semiconductor layer 148 or their composition may vary.

The mesas 156 and the second semiconductor layer 164 may be doped with p-type dopants and the first semiconductor layer 148 may be doped with n-type dopants. Accordingly, portions of the mesas 156 may act as an active region. The active region may be a p-n diode junction associated with the interface of the first semiconductor layer 148 and the mesas 156. Alternatively, the first semiconductor layer 148 and the mesas 156 may be doped with n-type dopants and the second semiconductor layer 164 may be doped with p-type dopants. Accordingly, portions of the mesas 156 may act as an active region. The active region may be a p-n diode junction associated with the interface of the mesas 156 and the second semiconductor layer 164. The active region in the mesas 156 may include one or more semiconductor layers that are doped n-type, doped p-type, or are undoped.

The active region may emit light upon application of a suitable voltage through the first semiconductor layer 148 and/or the second semiconductor layer 164. In alternative implementations, the conductivity types of the first semiconductor layer 148, the mesas 156, and the second semiconductor layer 164 may be reversed.

After the second semiconductor layer 164 is formed, the device may be processed in a number of ways to form topside electrical connections.

Figure 1N:
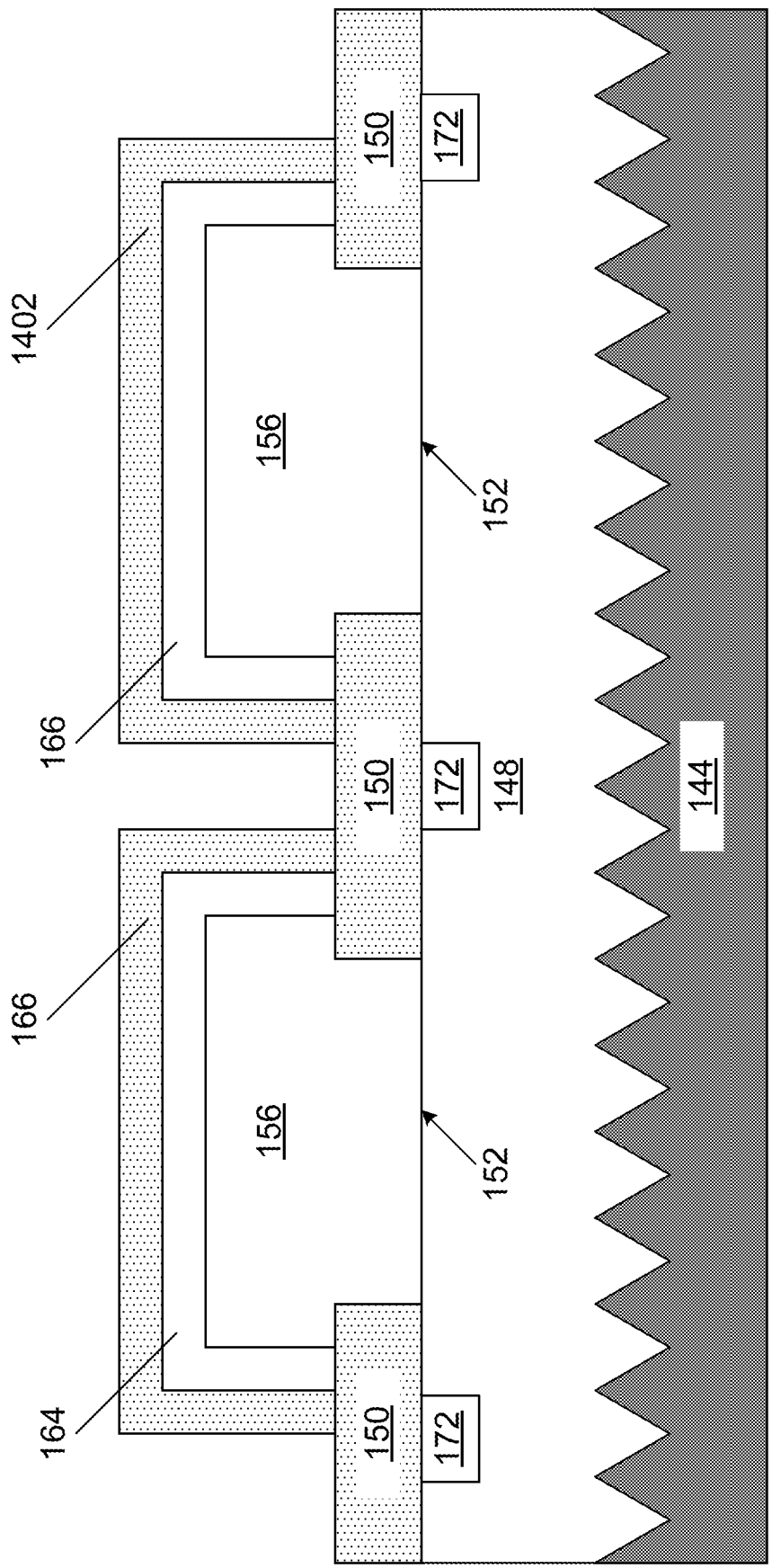
FIG. 1N illustrates forming a dielectric layer on the second semiconductor layer.
Figure 10:
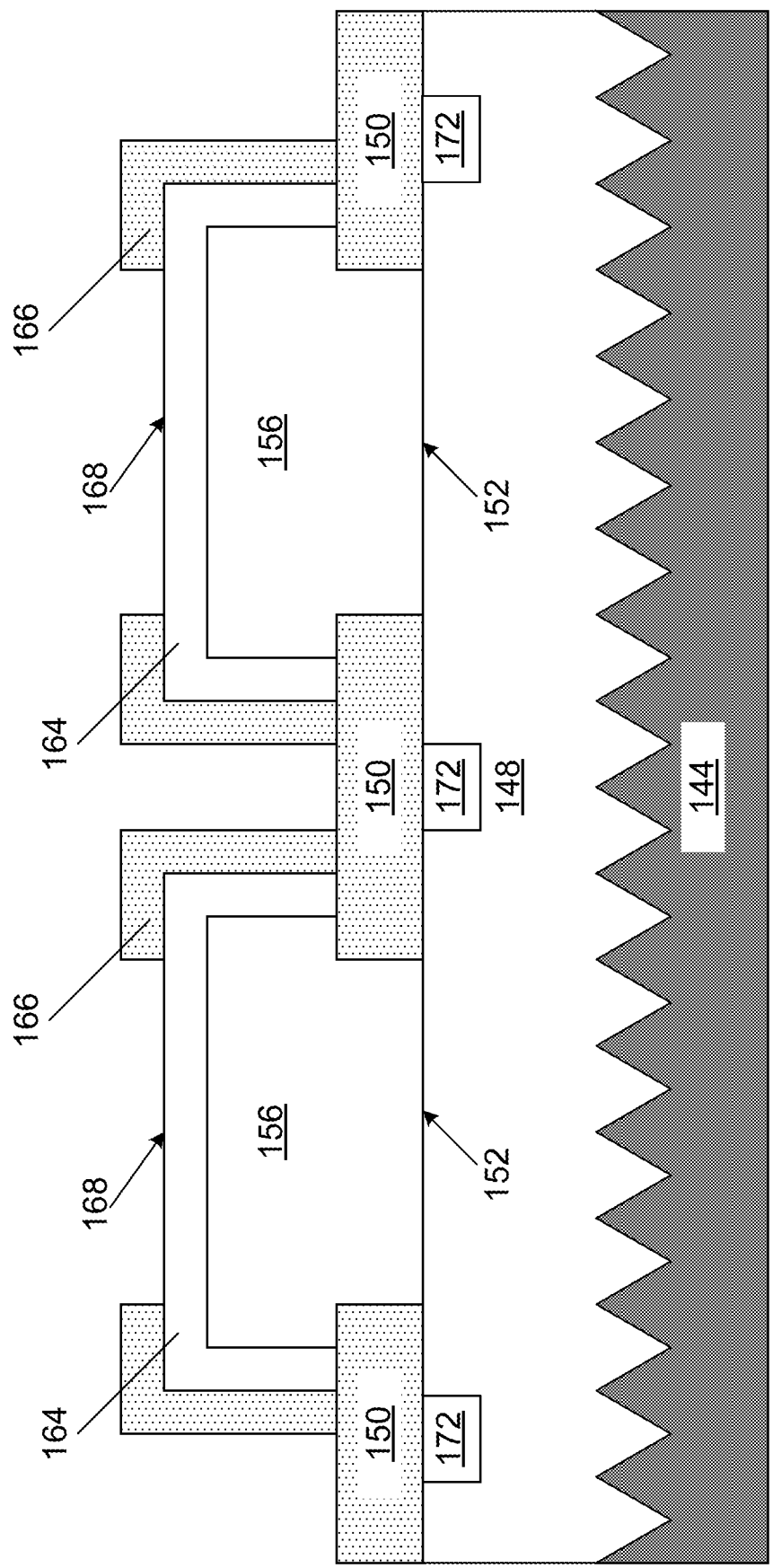

Referring now to FIGS. 14-15, cross-section views illustrating an example of forming topside electrical connections on the structure of FIG. 1M is shown. FIG. 1N illustrates forming a dielectric layer 166 on the second semiconductor layer 164. The dielectric layer 166 may be composed of a dielectric material, such as an oxide, a nitride, or an oxynitride. The dielectric layer 166 may be formed on the second semiconductor layer 164 using a conventional deposition technique, such as, for example, CVD, PECVD, MOCVD, ALD, evaporation, reactive sputtering, chemical solution deposition, spin-on deposition, or other like processes. In an example, the dielectric layer 166 may also be formed on the isolation regions 150 and removed using conventional patterning and etching techniques. FIG. 1O illustrates removing a portion of the dielectric layer 166 to expose an upper surface 168 of the second semiconductor layer 164. The exposed upper surface 168 of the second semiconductor layer 164 may serve as a contact. In an example, the second semiconductor layer 164 may be composed of a p-type material and the upper surface 168 may serve as a p-type contact.

Figure 1P:
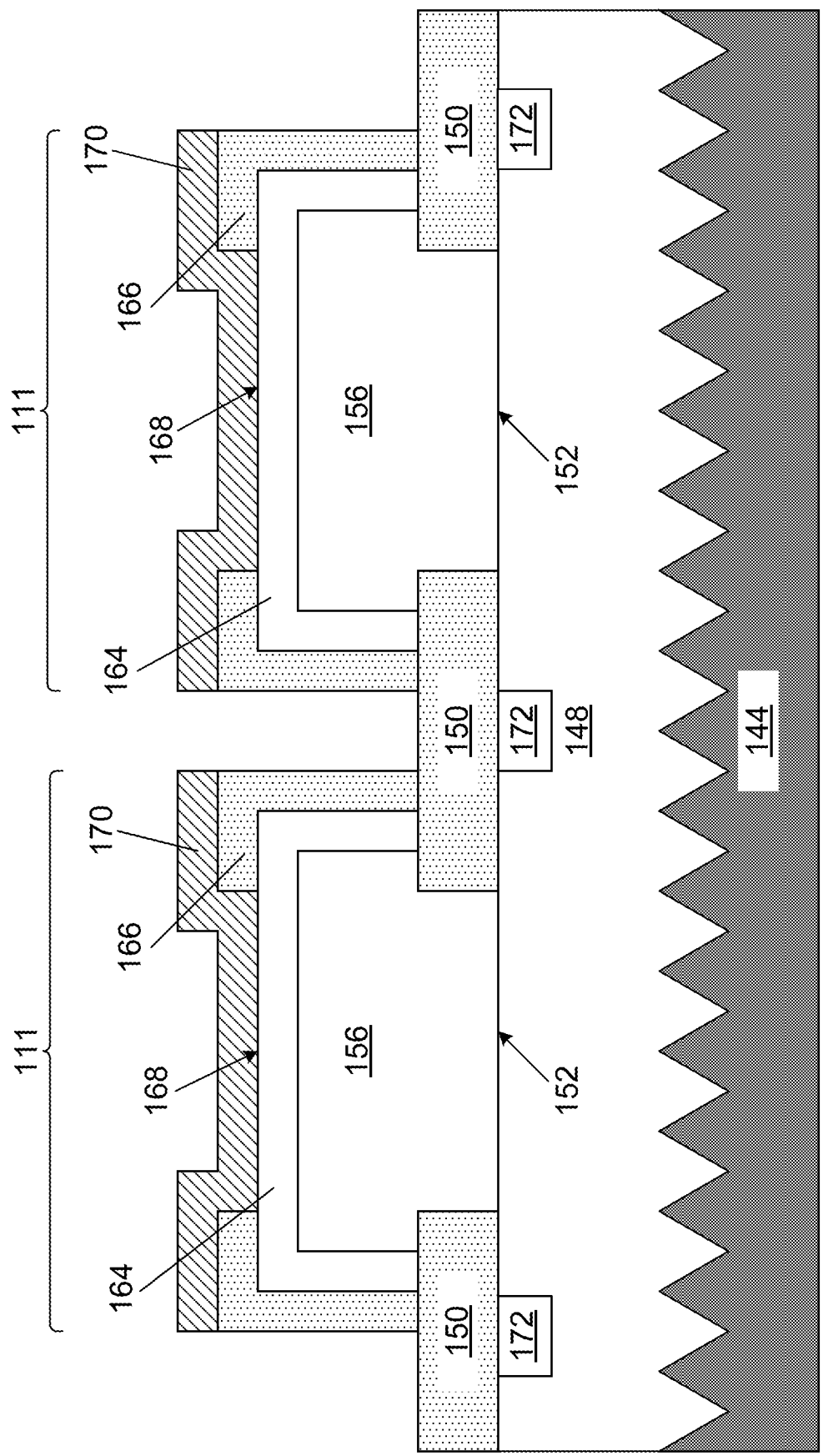
FIG. 1P is a cross-section view illustrating forming a metal contact layer over the mesas.

Referring now to FIG. 1P, a cross-section view illustrating forming a metal contact layer 170 over the mesas 156 to form one or more of the pixels 111 is shown. The metal contact layer 170 may be formed on the dielectric layer 166 and the second semiconductor layer 164. The metal contact layer 170 may be composed of one or more layers of a conductive metal or metal alloy, such as, gold, silver, copper. The metal contact layer 170 may be formed using a conventional deposition technique, such as, for example, CVD, PECVD, MOCVD, ALD, evaporation, reactive sputtering, chemical solution deposition, plating, spin-on deposition, or other like processes. The metal contact layer 170 may be patterned and etched using conventional techniques. The metal contact layer 170 may act as anode contact and a reflective layer. In an example, an airbridge may be used to form a contact in the first semiconductor layer.

Figure 1Q:
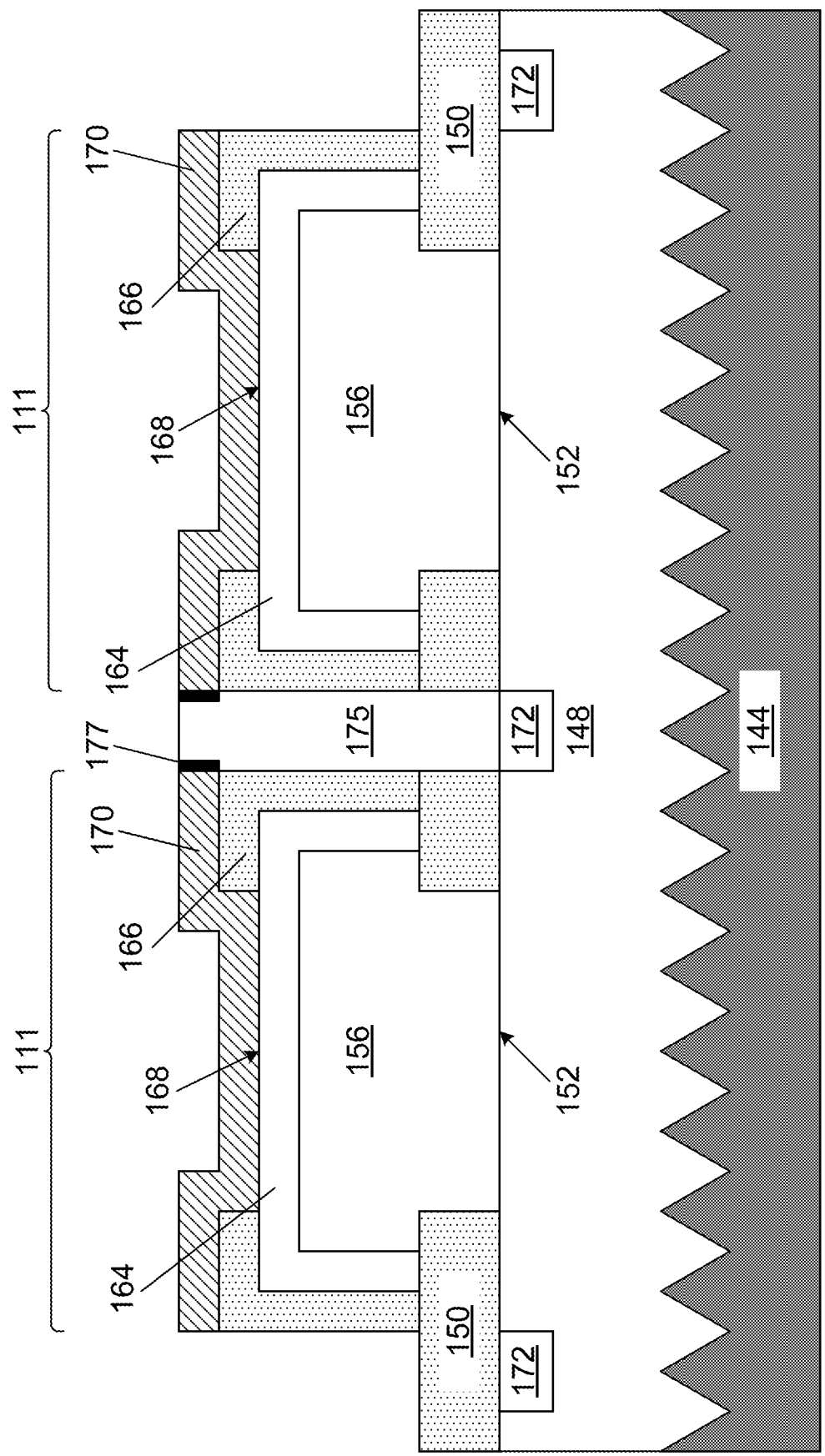
FIG. 1Q is a cross-section view illustrating forming a second contact through the isolation region.

Referring now to FIG. 1Q, a cross-section view illustrating forming a second contact 175 through the isolation region 150 is shown. The second contact 175 may be formed by etching a trench through the isolation region 150 and a portion of the first semiconductor layer 148 and filling it with one or more layers of a conductive metal or metal alloy, such as, gold, silver, copper. The second contact 175 may be formed using a conventional deposition technique, such as, for example, CVD, PECVD, MOCVD, ALD, evaporation, reactive sputtering, chemical solution deposition, plating, spin-on deposition, or other like processes. The second contact 175 may be similar to the n-type contact 1040 described above with reference to FIG. 1B. A passivation layer 177 may be formed between the second contact 175 and the metal contact layer 170. It should be noted that although one second contact 175 is shown, more than one second contact 175 may be formed in one or more isolation regions 150. It should be noted that the second contact 175 may be formed in any of the embodiments described herein using the process described above.

Figure 1R:
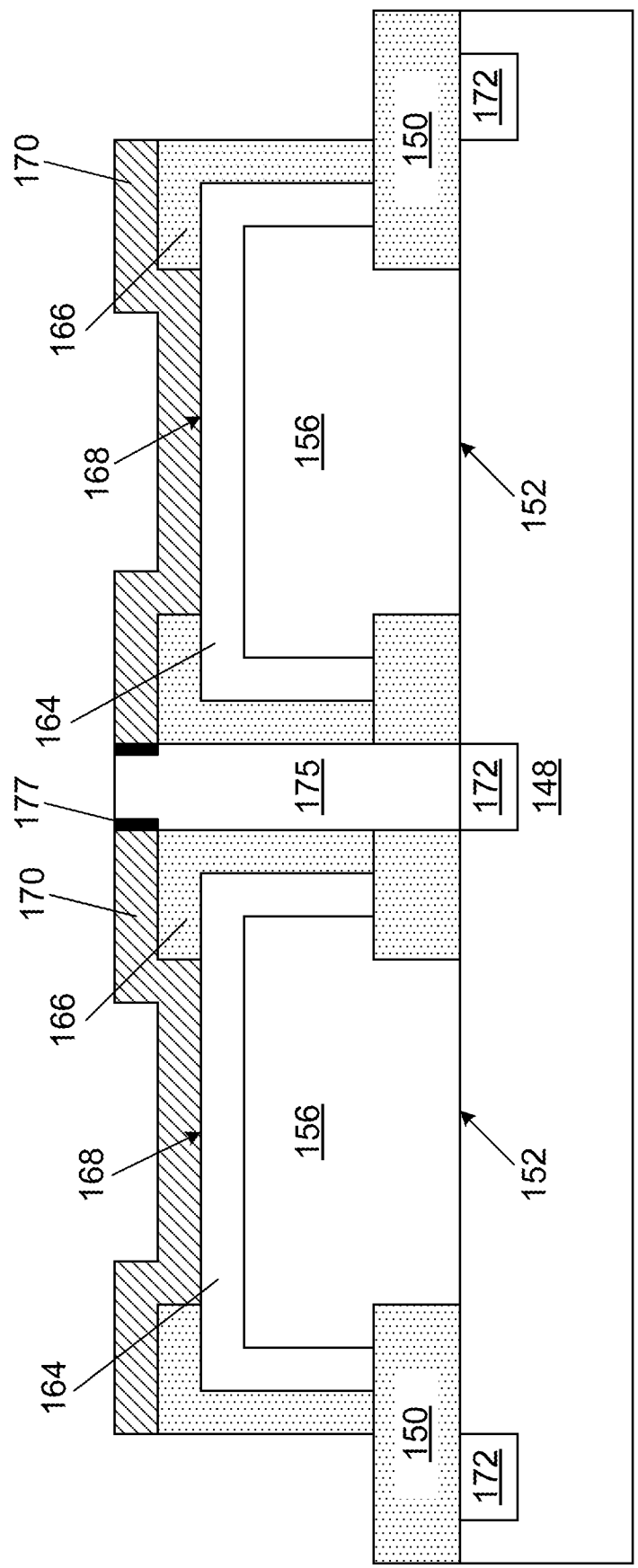
FIG. 1R is a cross section view illustrating removing the PSS substrate.

Referring now to FIG. 1R, a cross section view illustrating removing the PSS substrate 144 is shown. The PSS substrate 144 may be removed by a conventional process such as grinding, chemical mechanical polishing (CMP), or laser lift-off.

Figure 1S:
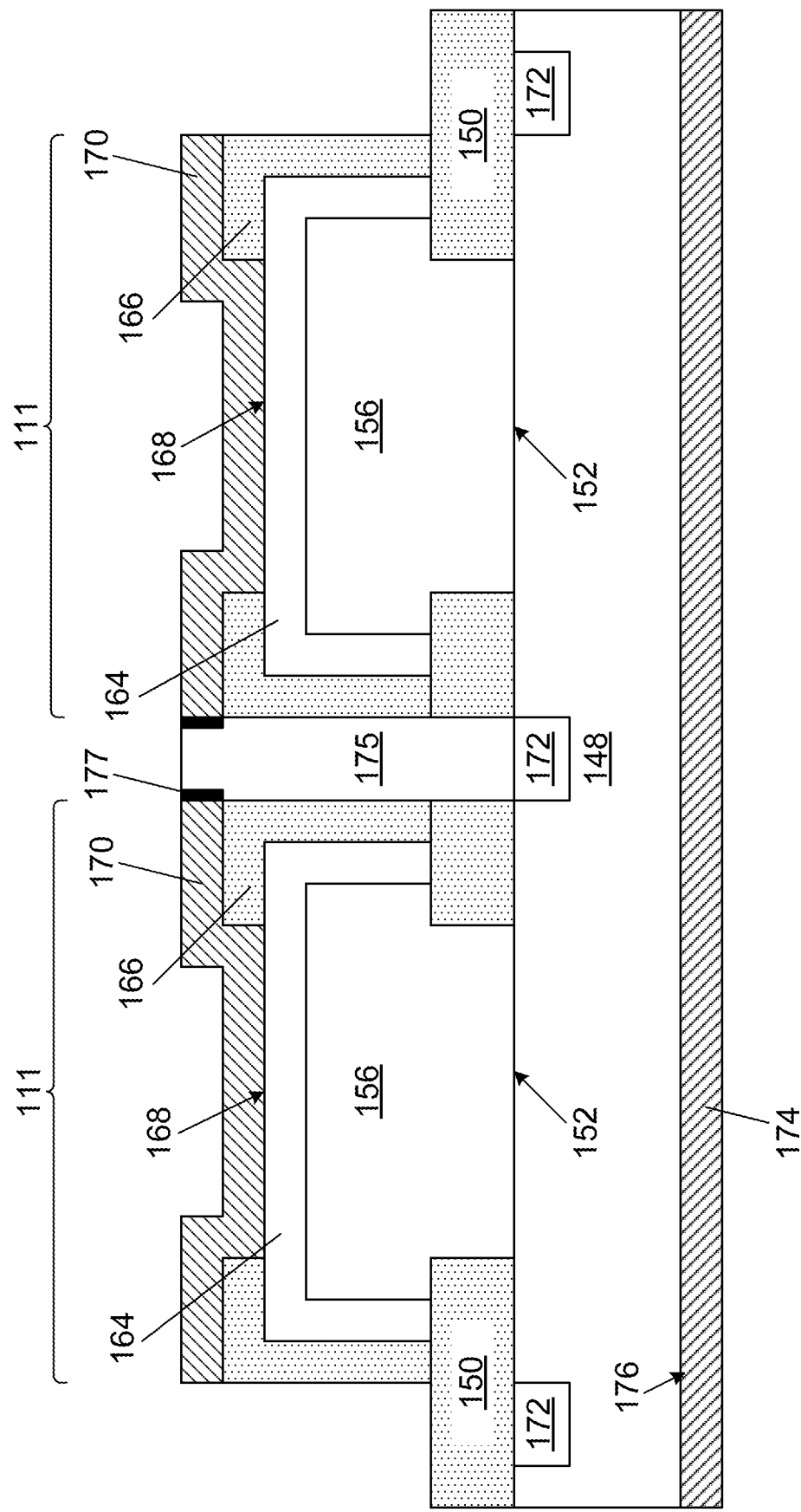
FIG. 1S is a cross-section view illustrating removing the PSS substrate and forming a common contact layer.

In another example, the PSS substrate may be removed to expose a backside of the device and a common contact may be formed. Referring now to FIG. 1S, a cross-section view illustrating removing the PSS substrate 144 and forming a common contact layer 174 is shown. The PSS substrate 144 may be removed by a conventional process such as grinding, chemical mechanical polishing (CMP), or laser lift-off. The removal of the PSS substrate 144 may expose a bottom surface 176 of the first semiconductor layer 148. In an example, the bottom surface 176 may be roughened after it is exposed.

The common contact layer 174 may be formed on the bottom surface 176 of the first semiconductor layer 148. The common contact layer 174 may be composed of a blanket transparent conductor. In an example, the common contact layer 174 may be composed of a transparent conductive oxide (TCO), such as indium tin oxide (ITO). The common contact layer 174 may be a p-type or an n-type contact. The common contact layer 174 may be formed using a conventional deposition technique, such as, for example, CVD, PECVD, MOCVD, ALD, evaporation, reactive sputtering, chemical solution deposition, spin-on deposition, or other like processes. Because the PSS substrate 144 is removed, a phosphor (not shown) may be mounted directly on the common contact layer 174 to form the LED emitters 102.

Figure 1T:
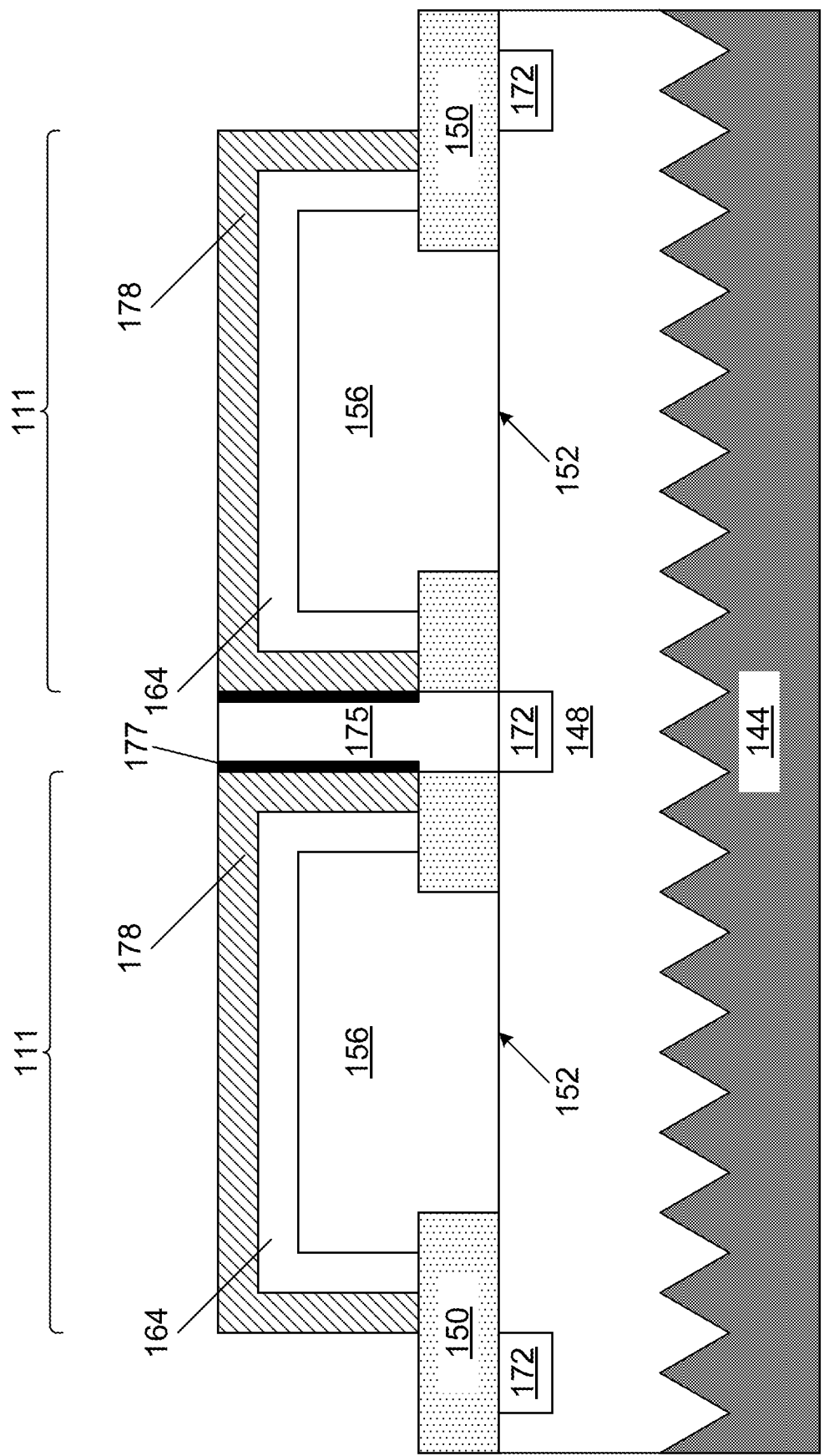
FIG. 1T is a cross section view illustrating forming a metal contact layer on the second semiconductor layer.

Referring now to FIG. 1T, a cross-section view illustrating another example of forming topside electrical connections in the structure of FIG. 1M is shown. FIG. 1T illustrates forming a metal contact layer 178 on the second semiconductor layer 164. The metal contact layer 170 may be composed of one or more layers of a conductive metal or metal alloy, such as, gold, silver, copper. The metal contact layer 178 may be formed using a conventional deposition technique, such as, for example, CVD, PECVD, MOCVD, ALD, evaporation, reactive sputtering, chemical solution deposition, plating, spin-on deposition, or other like processes. The metal contact layer 178 may be patterned and etched using conventional techniques.

Figure 1U:
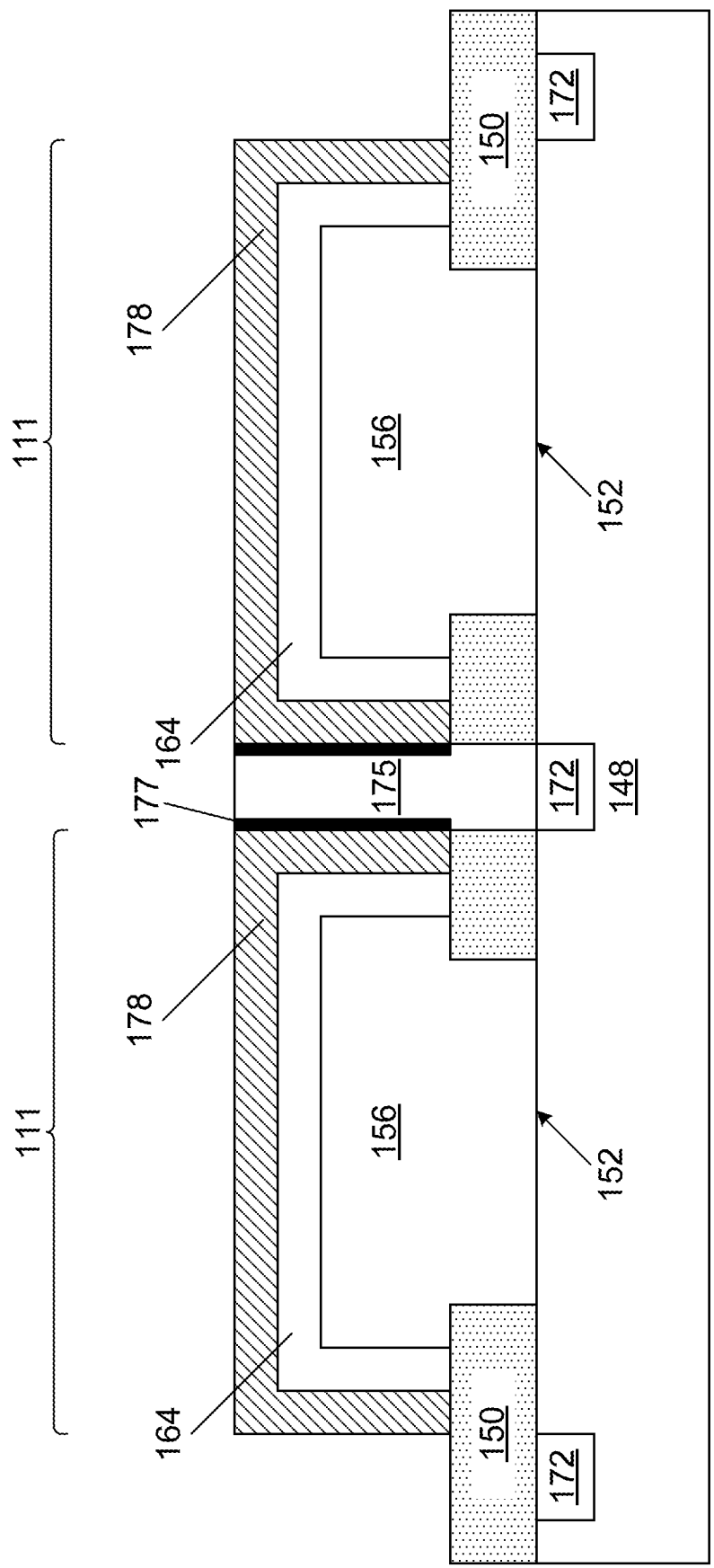
FIG. 1U a cross section view illustrating removing the PSS substrate.

Referring now to FIG. 1U, a cross section view illustrating removing the PSS substrate 144 is shown. The PSS substrate 144 may be removed by a conventional process such as grinding, chemical mechanical polishing (CMP), or laser lift-off.

An epitaxial layer may be formed on a sapphire substrate. The sapphire substrate may have one or more trenches in which the epitaxial layer is grown.

Figure 1V:
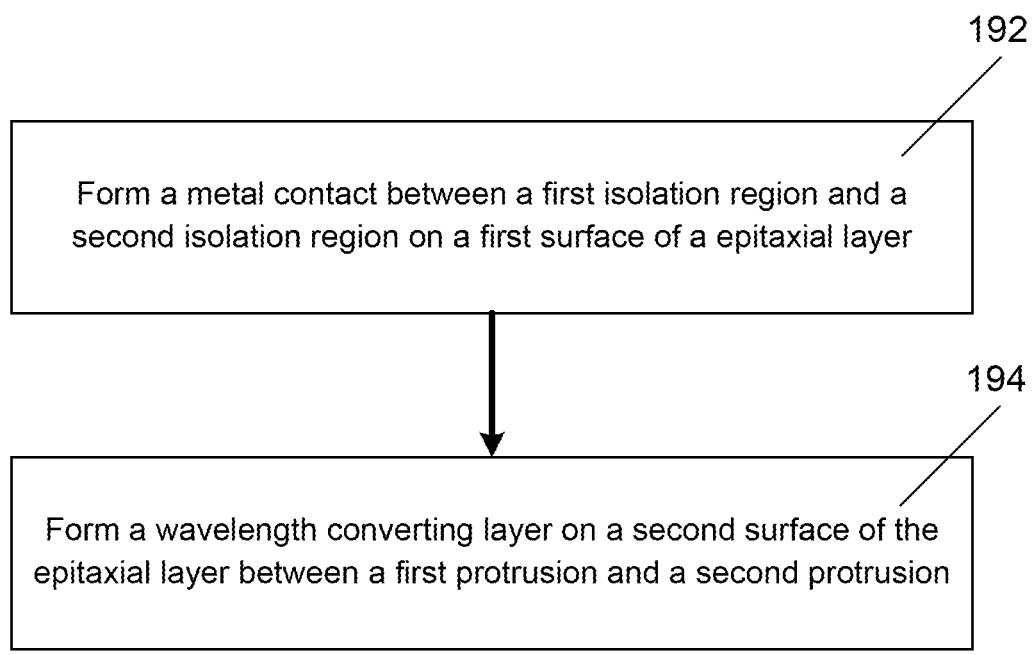
FIG. 1V is a flowchart illustrating a method of forming a device.

Referring now to FIG. 1V, a flowchart illustrating a method of forming a device is shown. In step 192, a metal contact may be formed between a first isolation region and a second isolation region on a first surface of the epitaxial layer. In step 194, a wavelength converting layer may be formed on a second surface of the epitaxial layer between the first sidewall and the second sidewall. The first surface may be distal to the second surface. The first sidewall and the second sidewall may be portions of the epitaxial layer that were formed in the trenches etched into the sapphire substrate. It should be noted that the term "distal" as used herein may be used as a directional term to mean a spatially opposites sides of an element, device, layer, or other structure. A first element and a second element that are on distal sides of a third element may be separated from one another by at least a portion of the third element. For example, an upper surface of a layer may be distal to a lower surface of the layer.

Figure 2A:
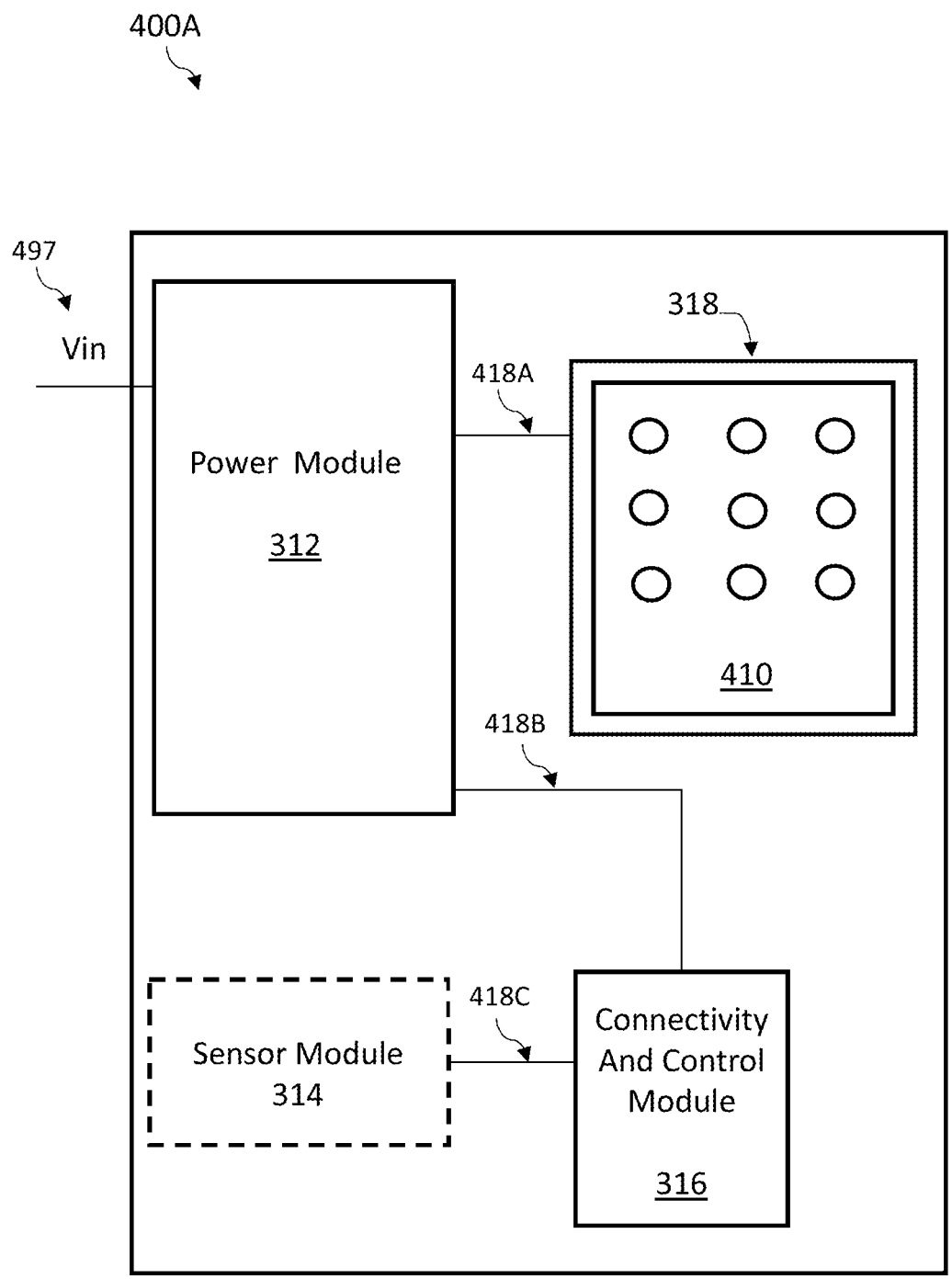
FIG. 2A is a top view of the electronics board with LED array attached to the substrate at the LED device attach region in one embodiment.

FIG. 2A is a top view of an electronics board with an LED array 410 attached to a substrate at the LED device attach region 318 in one embodiment. The electronics board together with the LED array 410 represents an LED system 400A. Additionally, the power module 312 receives a voltage input at Vin 497 and control signals from the connectivity and control module 316 over traces 418B, and provides drive signals to the LED array 410 over traces 418A. The LED array 410 is turned on and off via the drive signals from the power module 312. In the embodiment shown in FIG. 2A, the connectivity and control module 316 receives sensor signals from the sensor module 314 over trace 418C.

Figure 2B:
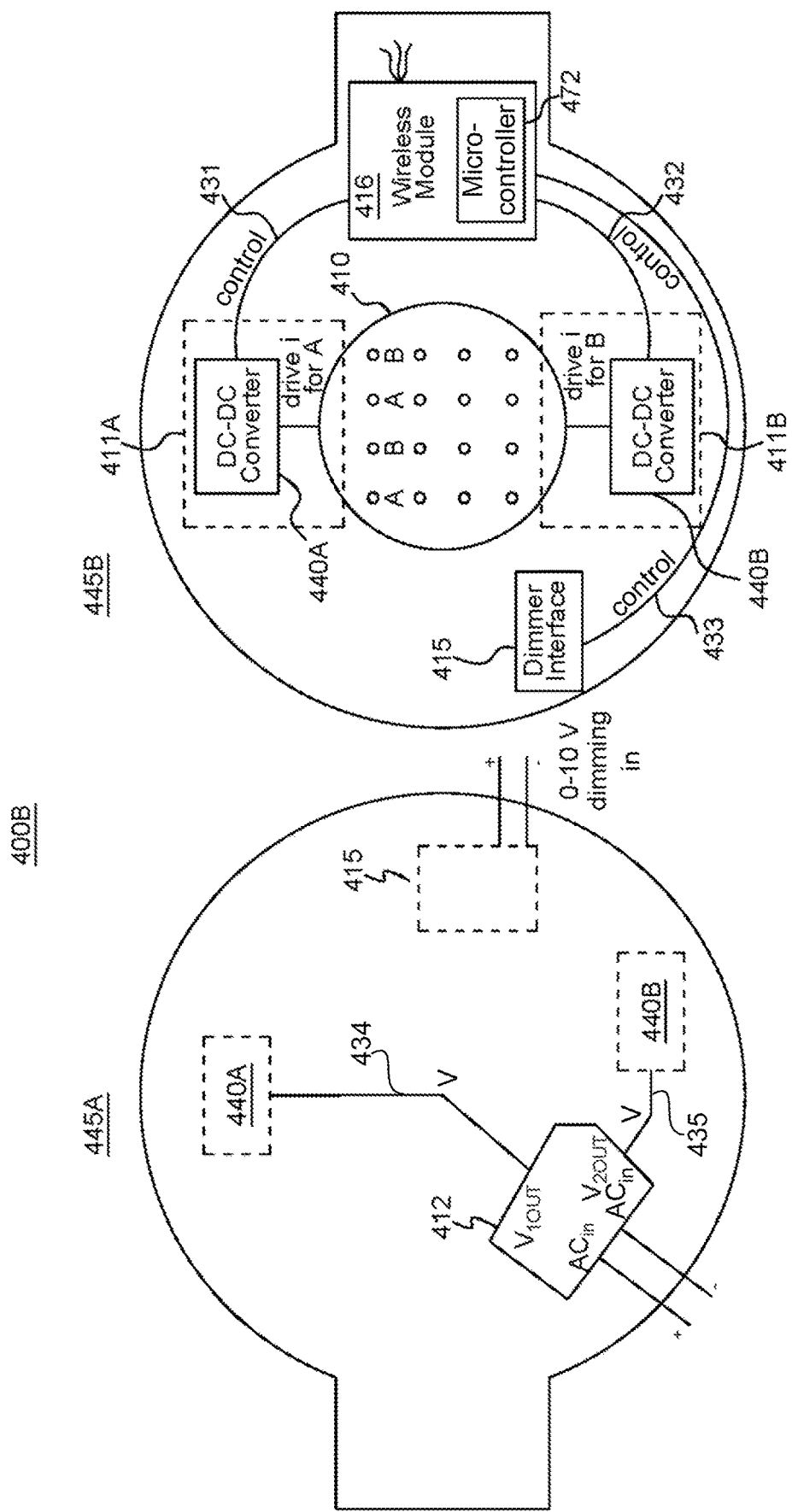
FIG. 2B is a diagram of one embodiment of a two channel integrated LED lighting system with electronic components mounted on two surfaces of a circuit board.

FIG. 2B illustrates one embodiment of a two channel integrated LED lighting system with electronic components mounted on two surfaces of a circuit board 499. As shown in FIG. 2B, an LED lighting system 400B includes a first surface 445A having inputs to receive dimmer signals and AC power signals and an AC/DC converter circuit 412 mounted on it. The LED system 400B includes a second surface 445B with the dimmer interface circuit 415, DC-DC converter circuits 440A and 440B, a connectivity and control module 416 (a wireless module in this example) having a microcontroller 472, and an LED array 410 mounted on it. The LED array 410 is driven by two independent channels 411A and 411B. In alternative embodiments, a single channel may be used to provide the drive signals to an LED array, or any number of multiple channels may be used to provide the drive signals to an LED array.

The LED array 410 may include two groups of LED devices. In an example embodiment, the LED devices of group A are electrically coupled to a first channel 411A and the LED devices of group B are electrically coupled to a second channel 411B. Each of the two DC-DC converters 440A and 440B may provide a respective drive current via single channels 411A and 411B, respectively, for driving a respective group of LEDs A and B in the LED array 410. The LEDs in one of the groups of LEDs may be configured to emit light having a different color point than the LEDs in the second group of LEDs. Control of the composite color point of light emitted by the LED array 410 may be tuned within a range by controlling the current and/or duty cycle applied by the individual DC/DC converter circuits 440A and 440B via a single channel 411A and 411B, respectively. Although the embodiment shown in FIG. 2B does not include a sensor module (as described in FIG. 2A), an alternative embodiment may include a sensor module.

The illustrated LED lighting system 400B is an integrated system in which the LED array 410 and the circuitry for operating the LED array 410 are provided on a single electronics board. Connections between modules on the same surface of the circuit board 499 may be electrically coupled for exchanging, for example, voltages, currents, and control signals between modules, by surface or sub-surface interconnections, such as traces 431, 432, 433, 434 and 435 or metallizations (not shown). Connections between modules on opposite surfaces of the circuit board 499 may be electrically coupled by through board interconnections, such as vias and metallizations (not shown).

According to embodiments, LED systems may be provided where an LED array is on a separate electronics board from the driver and control circuitry. According to other embodiments, a LED system may have the LED array together with some of the electronics on an electronics board separate from the driver circuit. For example, an LED system may include a power conversion module and an LED module located on a separate electronics board than the LED arrays.

According to embodiments, an LED system may include a multi-channel LED driver circuit. For example, an LED module may include embedded LED calibration and setting data and, for example, three groups of LEDs. One of ordinary skill in the art will recognize that any number of groups of LEDs may be used consistent with one or more applications. Individual LEDs within each group may be arranged in series or in parallel and the light having different color points may be provided. For example, warm white light may be provided by a first group of LEDs, a cool white light may be provided by a second group of LEDs, and a neutral white light may be provided by a third group.

Figure 2C:
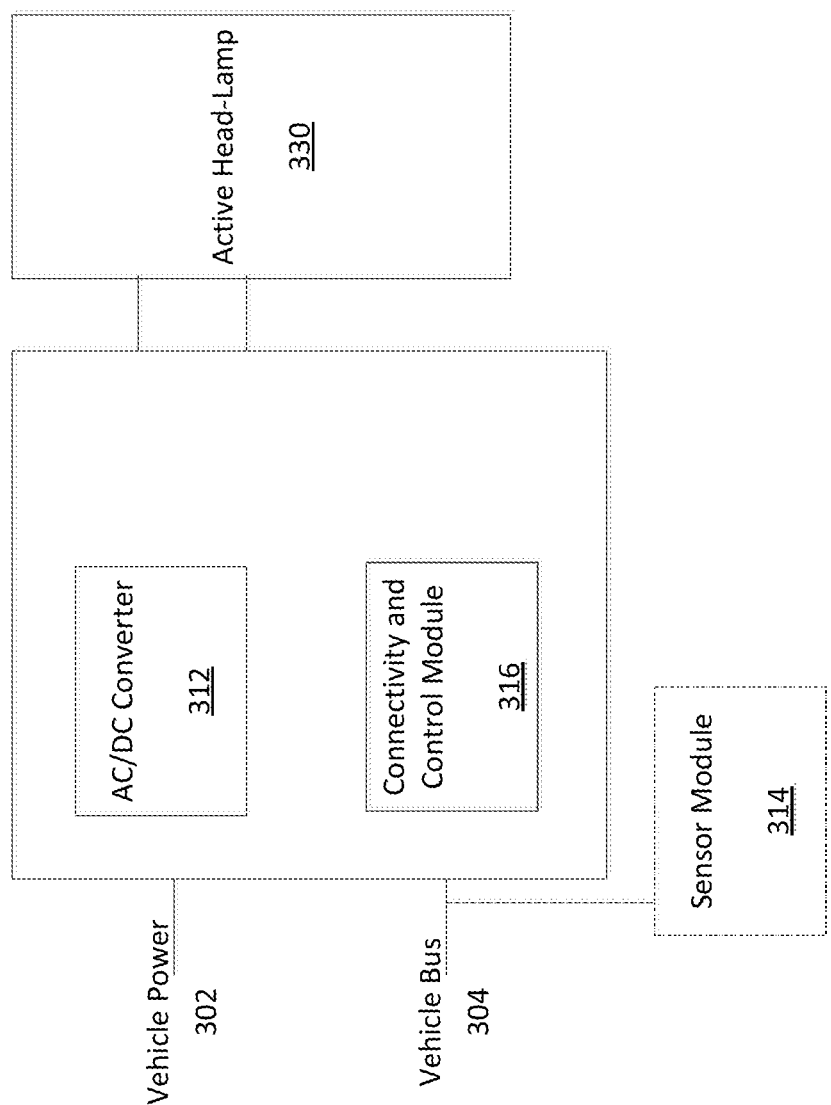
FIG. 2C is an example vehicle headlamp system.

FIG. 2C shows an example vehicle headlamp system 300 including a vehicle power 302 including a data bus 304. A sensor module 307 may be connected to the data bus 304 to provide data related to environment conditions (e.g. ambient light conditions, temperature, time, rain, fog, etc.), vehicle condition (parked, in-motion, speed, direction), presence/position of other vehicles, pedestrians, objects, or the like. The sensor module 307 may be similar to or the same as the sensor module 314 of FIG. 2A. AC/DC Converter 305 may be connected to the vehicle power 302.

The AC/DC converter 312 of FIG. 2C may be the same as or similar to the AC/DC converter 412 of FIG. 2B and may receive AC power from the vehicle power 302. It may convert the AC power to DC power as described in FIG. 2B for AC-DC converter 412. The vehicle head lamp system 300 may include an active head lamp 330 which receives one or more inputs provided by or based on the AC/DC converter 305, connectivity and control module 306, and/or sensor module 307. As an example, the sensor module 307 may detect the presence of a pedestrian such that the pedestrian is not well lit, which may reduce the likelihood that a driver sees the pedestrian. Based on such sensor input, the connectivity and control module 306 may output data to the active head lamp 330 using power provided from the AC/DC converter 305 such that the output data activates a subset of LEDs in an LED array contained within active head lamp 330. The subset of LEDs in the LED array, when activated, may emit light in the direction where the sensor module 307 sensed the presence of the pedestrian. These subset of LEDs may be deactivated or their light beam direction may otherwise be modified after the sensor module 207 provides updated data confirming that the pedestrian is no longer in a path of the vehicle that includes vehicle head lamp system.

Figure 3:
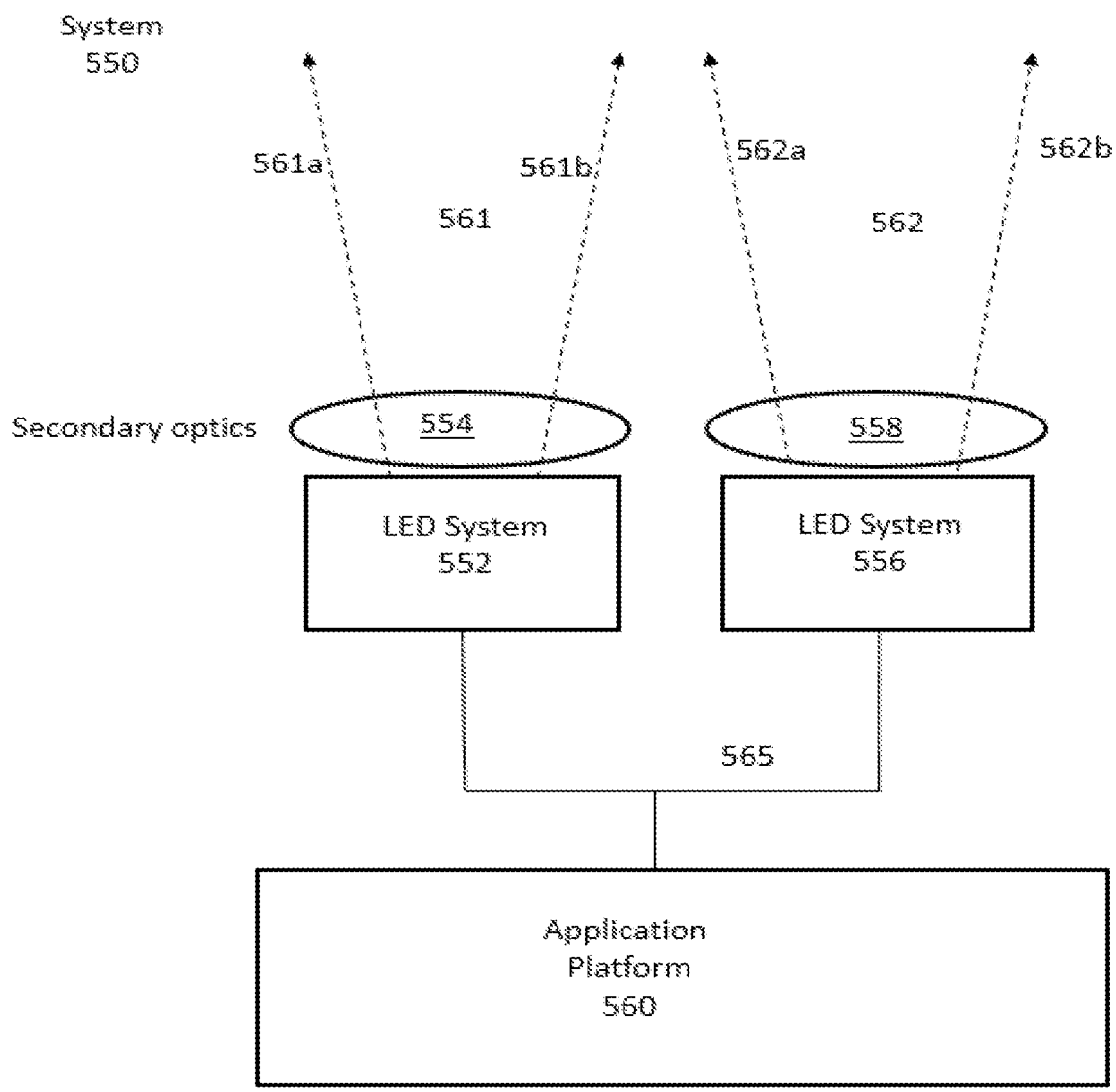
FIG. 3 shows an example illumination system.

FIG. 3 shows an example system 550 which includes an application platform 560, LED systems 552 and 556, and optics 554 and 558. The LED System 552 produces light beams 561 shown between arrows 561a and 561b. The LED System 556 may produce light beams 562 between arrows 562a and 562b. In the embodiment shown in FIG. 3, the light emitted from LED System 552 passes through secondary optics 554, and the light emitted from the LED System 556 passes through secondary optics 554. In alternative embodiments, the light beams 561 and 562 do not pass through any secondary optics. The secondary optics may be or may include one or more light guides. The one or more light guides may be edge lit or may have an interior opening that defines an interior edge of the light guide. LED systems 552 and/or 556 may be inserted in the interior openings of the one or more light guides such that they inject light into the interior edge (interior opening light guide) or exterior edge (edge lit light guide) of the one or more light guides. LEDs in LED systems 552 and/or 556 may be arranged around the circumference of a base that is part of the light guide. According to an implementation, the base may be thermally conductive. According to an implementation, the base may be coupled to a heat-dissipating element that is disposed over the light guide. The heat-dissipating element may be arranged to receive heat generated by the LEDs via the thermally conductive base and dissipate the received heat. The one or more light guides may allow light emitted by LED systems 552 and 556 to be shaped in a desired manner such as, for example, with a gradient, a chamfered distribution, a narrow distribution, a wide distribution, an angular distribution, or the like.

In example embodiments, the system 550 may be a mobile phone of a camera flash system, indoor residential or commercial lighting, outdoor light such as street lighting, an automobile, a medical device, AR/VR devices, and robotic devices. The LED System 400A shown in FIG. 2A and vehicle head lamp system 300 shown in FIG. 2C illustrate LED systems 552 and 556 in example embodiments.

The application platform 560 may provide power to the LED systems 552 and/or 556 via a power bus via line 565 or other applicable input, as discussed herein. Further, application platform 560 may provide input signals via line 565 for the operation of the LED system 552 and LED system 556, which input may be based on a user input/preference, a sensed reading, a pre-programmed or autonomously determined output, or the like. One or more sensors may be internal or external to the housing of the application platform 560. Alternatively, or in addition, as shown in the LED system 400 of FIG. 2A, each LED System 552 and 556 may include its own sensor module, connectivity and control module, power module, and/or LED devices.

In embodiments, application platform 560 sensors and/or LED system 552 and/or 556 sensors may collect data such as visual data (e.g., LIDAR data, IR data, data collected via a camera, etc.), audio data, distance based data, movement data, environmental data, or the like or a combination thereof. The data may be related to a physical item or entity such as an object, an individual, a vehicle, etc. For example, sensing equipment may collect object proximity data for an ADAS/AV based application, which may prioritize the detection and subsequent action based on the detection of a physical item or entity. The data may be collected based on emitting an optical signal by, for example, LED system 552 and/or 556, such as an IR signal and collecting data based on the emitted optical signal. The data may be collected by a different component than the component that emits the optical signal for the data collection. Continuing the example, sensing equipment may be located on an automobile and may emit a beam using a vertical-cavity surface-emitting laser (VCSEL). The one or more sensors may sense a response to the emitted beam or any other applicable input.

In example embodiment, application platform 560 may represent an automobile and LED system 552 and LED system 556 may represent automobile headlights. In various embodiments, the system 550 may represent an automobile with steerable light beams where LEDs may be selectively activated to provide steerable light. For example, an array of LEDs may be used to define or project a shape or pattern or illuminate only selected sections of a roadway. In an example embodiment, infrared cameras or detector pixels within LED systems 552 and/or 556 may be sensors (e.g., similar to sensors module 314 of FIG. 2A and 307 of FIG. 2C) that identify portions of a scene (roadway, pedestrian crossing, etc.) that require illumination.

Having described the embodiments in detail, those skilled in the art will appreciate that, given the present description, modifications may be made to the embodiments described herein without departing from the spirit of the inventive concept. Therefore, it is not intended that the scope of the invention be limited to the specific embodiments illustrated and described.

What is claimed is:

1. An LED array comprising:
   a plurality of pixels, each pixel separated from an adjacent pixel by a trench extending from a p-type semiconductor layer to a distal surface of an n-type semiconductor layer;
   an n-type contact in the trench;
   the n-type semiconductor layer disposed on an active layer on the p-type semiconductor layer;
   a wavelength converting layer on the n-type semiconductor layer on a surface opposite the active layer;
   a p-type contact on the p-type semiconductor layer; and
   one or more passivation layer extending from the p-type semiconductor layer to the n-type semiconductor layer and separating the n-type contact from the active layer and the p-type layer, the one or more passivation layer extending at least partially on a sidewall of the n-type semiconductor layer,
   wherein at least part of the wavelength converting layer is separated by the n-type contact in the trench.

2. The LED array of claim 1, wherein the n-type contact in the trench forms a protrusion separating the wavelength converting layer on each pixel.

3. The LED array of claim 1, wherein the active layer comprises a partially doped or undoped Type III-nitride.

4. The LED array of claim 1, wherein the n-type contact extends to the wavelength converting layer and provides at least partial optical isolation between each pixel.

5. The LED array of claim 1, wherein the n-type layer and p-type layer are not continuous between the plurality of pixels.

6. An LED array comprising:
   a plurality of pixels, each pixel separated from an adjacent pixel by a trench extending from a p-type semiconductor layer to a distal surface of an n-type semiconductor layer;
   an n-type contact in the trench;
   the n-type semiconductor layer disposed on an active layer on the p-type semiconductor layer;
   a wavelength converting layer on the n-type semiconductor layer on a surface opposite the active layer;
   a p-type contact on the p-type semiconductor layer; and
   one or more passivation layer extending from the p-type semiconductor layer to the n-type semiconductor layer and separating the n-type contact from the active layer and the p-type layer, the one or more passivation layer extending at least partially on a sidewall of the n-type semiconductor layer,
   wherein the n-type contact extends to the wavelength converting layer and provides at least partial optical isolation between each pixel.

7. The LED array of claim 6, wherein at least part of the wavelength converting layer is separated by the n-type contact in the trench.

8. The LED array of claim 7, wherein the n-type contact in the trench forms a protrusion separating the wavelength converting layer on each pixel.

9. The LED array of claim 6, wherein the active layer comprises a partially doped or undoped Type III-nitride.

10. The LED array of claim 6, wherein the n-type layer and p-type layer are not continuous between the plurality of pixels.

* * * * *